(12) United States Patent
Uchida

(10) Patent No.: US 7,730,442 B2
(45) Date of Patent: Jun. 1, 2010

(54) APPARATUS FOR DESIGNING CIRCUIT AND METHOD FOR DESIGNING CIRCUIT ACCORDING TO CLEARANCE REQUIRED BETWEEN WIRINGS THEREIN

(75) Inventor: Risako Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 343 days.

(21) Appl. No.: 11/828,788

(22) Filed: Jul. 26, 2007

(65) Prior Publication Data

US 2008/0034340 A1    Feb. 7, 2008

(30) Foreign Application Priority Data

Aug. 7, 2006  (JP) .............................. 2006-214576

(51) Int. Cl.
*G06F 17/50*    (2006.01)
(52) U.S. Cl. ................................. 716/14; 716/8; 716/10
(58) Field of Classification Search ...................... 716/8, 716/10, 14
See application file for complete search history.

(56) References Cited

U.S. PATENT DOCUMENTS

| | | | | |
|---|---|---|---|---|
| 2005/0262463 A1* | 11/2005 | Cohn et al. | ................... | 716/10 |
| 2006/0080628 A1* | 4/2006 | Enomoto et al. | ................ | 716/8 |
| 2006/0156267 A1* | 7/2006 | Kato | ........................... | 716/13 |
| 2006/0277517 A1* | 12/2006 | Zhang et al. | ................... | 716/13 |
| 2007/0061770 A1* | 3/2007 | Kobayashi | ................... | 716/13 |
| 2007/0300195 A1* | 12/2007 | Li | .............................. | 716/5 |

FOREIGN PATENT DOCUMENTS

JP          11-39365 A        2/1999

* cited by examiner

*Primary Examiner*—Stacy A Whitmore
(74) *Attorney, Agent, or Firm*—Sughrue Mion, PLLC

(57) ABSTRACT

An apparatus for designing a circuit comprises an arranging element which arranges a first wiring required a predetermined clearance between the first wiring and other wirings and a second wiring being thinner in a wiring width than the first wiring, a calculating element which calculates a particular part of the second wiring, the particular part is required to keep the clearance between the particular part and other wirings; and an area generating element which generates an area indicative of a position apart from the first wiring and the particular part by a distance corresponding to the clearance.

15 Claims, 27 Drawing Sheets

APPARATUS FOR DESIGNING CIRCUIT AND METHOD FOR DESIGNING CIRCUIT ACCORDING TO CLEARANCE REQUIRED BETWEEN WIRINGS THEREIN

BACKGROUND OF THE INVENTION

The present invention relates to an information processing unit and a wiring design method suitable for the design of wiring layout of a semiconductor integrated circuit, and more particularly to an information processing unit and a wiring design method for realizing an efficiency of a wiring layout editing.

A related art (Laid-Open Hei 11-39365) checks the minimum clearance between wiring figures that are arranged by a layout design system and produces error figures 2600 indicative of error portions as shown in FIG. 26. The system of the related art indicates a portion that does not satisfy the conditions of the minimum clearance. FIG. 3 in the related art (Laid-Open Hei 11-39365) shows the technique that conducts the design rule check to produce the error figure.

SUMMARY OF THE INVENTION

The related art that indicates the error portions by the aid of the error figure has following problems.

According to the related art, it is difficult to determine how much the wiring indicated by the error figure is moved to satisfy the condition of the minimum clearance. The error figure of the related art indicates only the portion that does not satisfy the minimum clearance condition between the wirings. Hence, it is necessary that a distance corresponding to the minimum clearance from any one of the wirings is measured on the basis of that wiring and then move the wiring. In this way, since it is necessary to measure the distance in order to eliminate the error, the design efficiency is deteriorated.

Also, recently, in a layout where a thinner wiring 2701 is connected to a thicker line 2700 as shown in FIG. 27, the design rule of the thicker line wiring 2700 is applied to a part of the thinner wiring 2701. In FIG. 27, the design rule of the thicker wiring 2700 is applied to a shaded portion of the wiring 2701. This new design rule emerges with the miniaturization of the wiring clearance in a semiconductor manufacturing process, and that design rule is called "influence rule."

A required clearance between the thinner wirings 2701 and 2702 is a first minimum clearance 2703 shown in FIG. 27. Also, a required clearance between the thicker wiring 2700 and the thinner wiring 2702 is a second minimum clearance 2704 shown in FIG. 27. The clearance between the wiring 2702 and the wiring 2701 is longer than the first minimum clearance 2703. Also, the clearance between the wiring 2702 and the wiring 2700 is longer than the second minimum clearance 2704. Hence, the wiring 2702 satisfies the design rule when the influence rule is not applied. However, the design rule of the thicker wiring 2700 is applied to the shaded portion of the wiring 2701 according to the influence rule. Therefore, an error figure 2705 is indicated unless the clearance between the shaded portion of the wiring 2701 and the wiring 2702 is longer than the second minimum clearance 2704. In the case where the influence rule is thus applied, the related art suffers from such a problem that a range to which the first minimum clearance 2703 is applied and a range to which the second minimum clearance 2704 is applied are indefinite. For that reason, the efficiency of the operation of editing the wiring arrangement for correcting the error is deteriorated.

Therefore, an exemplary object of the present invention is to solve the above problems.

In order to achieve the above object, according to the present invention, there is provided an apparatus for designing a circuit comprising an arranging element which arranges a first wiring required a predetermined clearance between the first wiring and other wirings and a second wiring being thinner in a wiring width than the first wiring, a calculating element which calculates a particular part of the second wiring, the particular part is required to keep the clearance between the particular part and other wirings, and an area generating element which generates an area indicative of a position apart from the first wiring and the particular part by a distance corresponding to the clearance.

BRIEF DESCRIPTION OF THE DRAWINGS

Other features and advantages of the invention will be made more apparent by the following detailed description and the accompanying drawings, wherein.

DETAILED DESCRIPTION OF THE PREFERRED EMBODIMENTS

Now, a description will be given of exemplary embodiments of the present invention with reference to the accompanying drawings.

A first exemplary embodiment of the present invention will be described.

Figure 1:
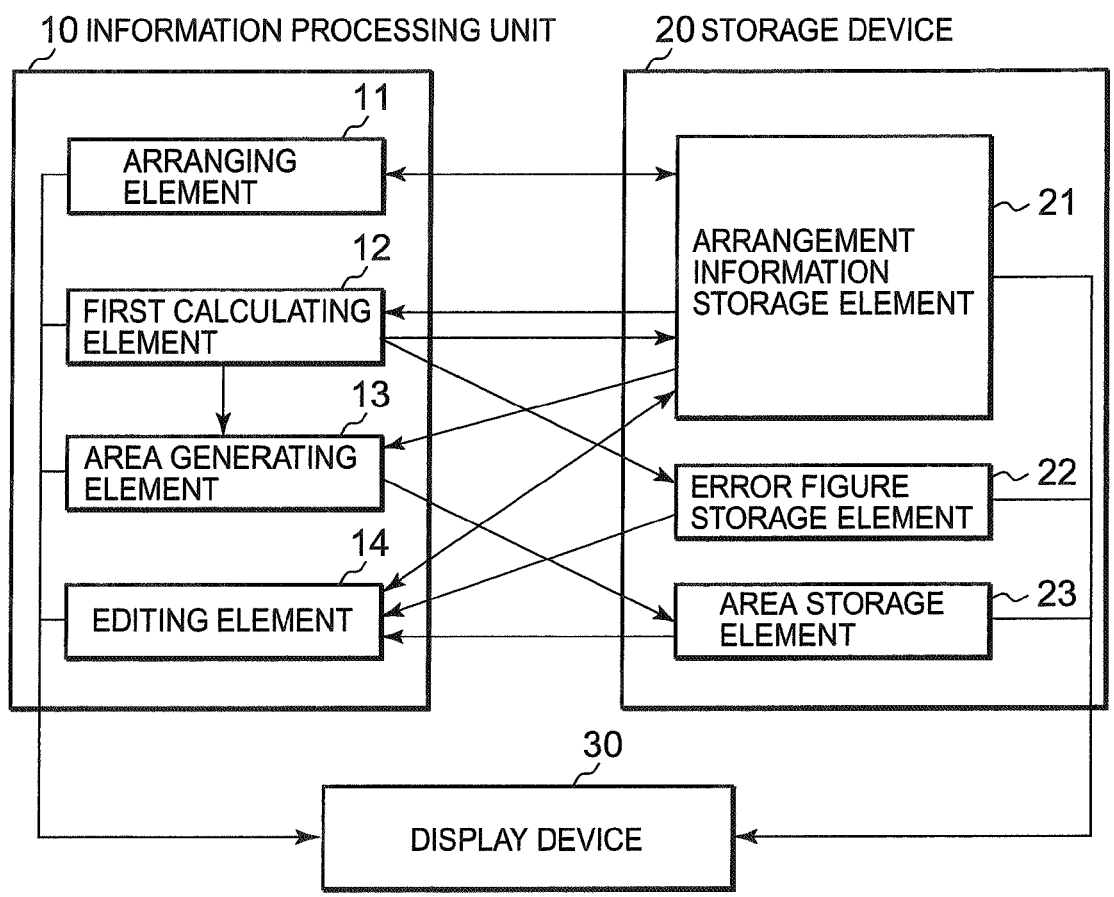
FIG. 1 is a block diagram illustrating a first exemplary embodiment of the present invention.

FIG. 1 shows the configuration of the first exemplary embodiment of the present invention.

An information processing unit 10 according to the first exemplary embodiment of the present invention includes an arranging element 11, a first calculating element 12, an area generating element 13, and an editing element 14. The information processing unit 10 may be used for designing a circuit with CAD (computer-aided design). A storage device 20 that is connected to the information processing unit 10 includes an arrangement information storage element 21, an error figure storage element 22, and an area storage element 23. The information processing unit 10 and the storage device 20 are connected with a display device 30.

Figure 2:
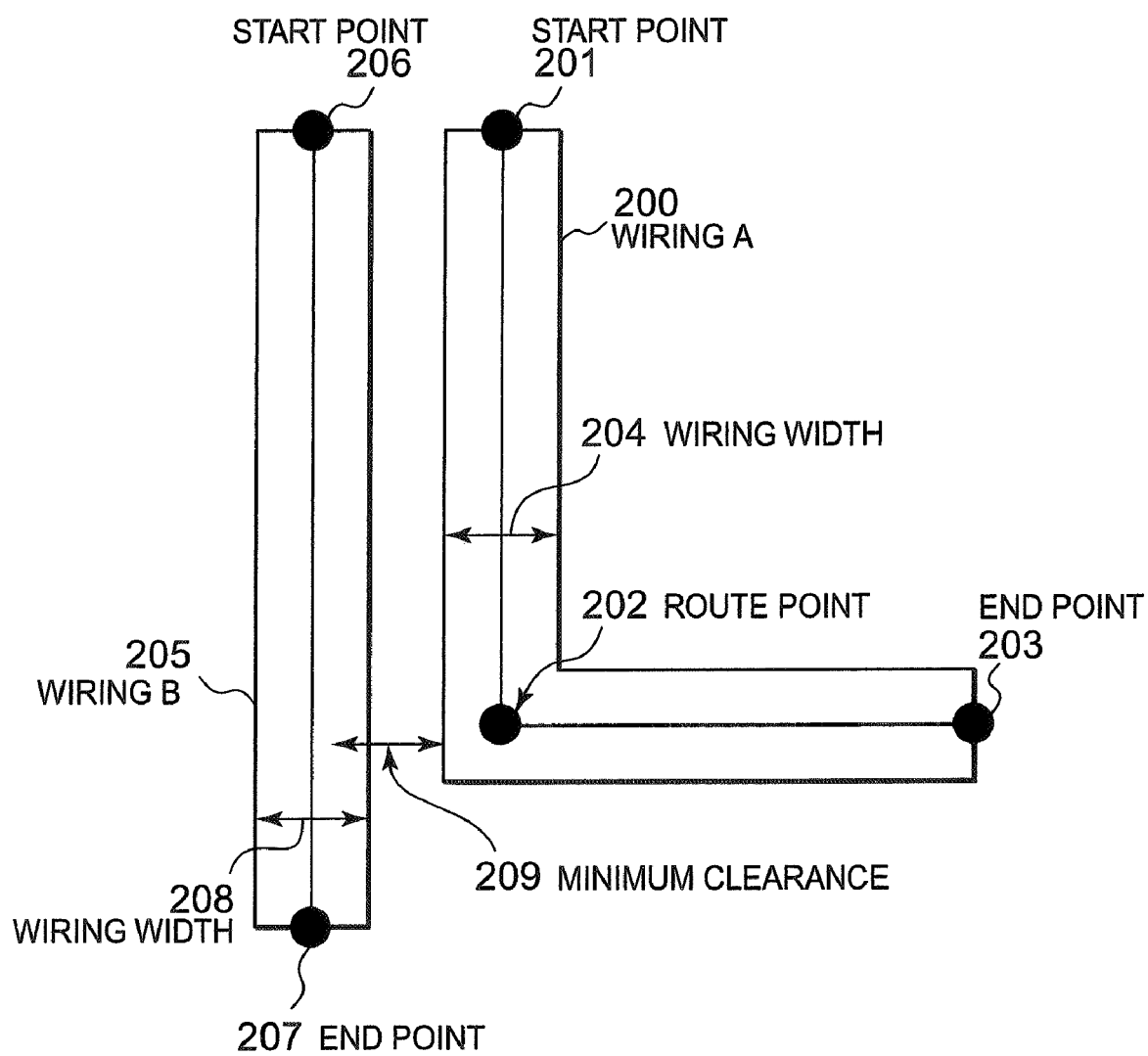
FIG. 2 is an explanatory diagram showing the first exemplary embodiment of the present invention.

The arranging element 11 arranges circuit components, and arranges wirings that connect between the circuit components. The results of the layout of the circuit components and the wirings are stored in the arrangement information storage element 21. An example of the layout is shown in FIG. 2. The results of the layout include information on coordinates of start points 201, 206, a route point 202, and endpoints 203, 207, and wiring widths 204, 208 as indicated in a wiring A (200) and a wiring B (205). The circuit component and the wirings arrangement is displayed on the display device 30.

The first calculating element 12 executes given calculation processing on the layout result that is stored in the arrangement information storage element 21 by the arranging element 11. The first calculating element 12 generates polygons such as the wiring A (200) and the wiring B (205) shown in FIG. 2 on the basis of the layout result. The first calculating element 12 stores the generated polygons in the arrangement information storage element 21. Also, the first calculating element 12 executes a check on a required clearance between the wirings. As shown in FIG. 2, the required clearance corresponding to a minimum clearance 209 is needed between the wiring A (200) and other wirings according to the design rule as shown in FIG. 2. The first calculating element 12 calculates the minimum clearance between the respective wirings on the basis of the design rule that is determined with respect to the respective wirings. The required clearance is the minimum clearance necessary between a certain wiring and other wirings. The first calculating element 12 checks whether a clearance between the wiring A (200) and the wiring B (205) is equal to or longer than the minimum clearance 209, or not. In the case where there is not enough clearance corresponding to the minimum clearance 209 between the wiring A (200) and the wiring B (205), the first calculating element 12 generates an error figure, and stores the error figure in the error figure storage element 22. The error figure is displayed on the display device 30 together with the wiring A (200) and the wiring B (205).

Figure 3:
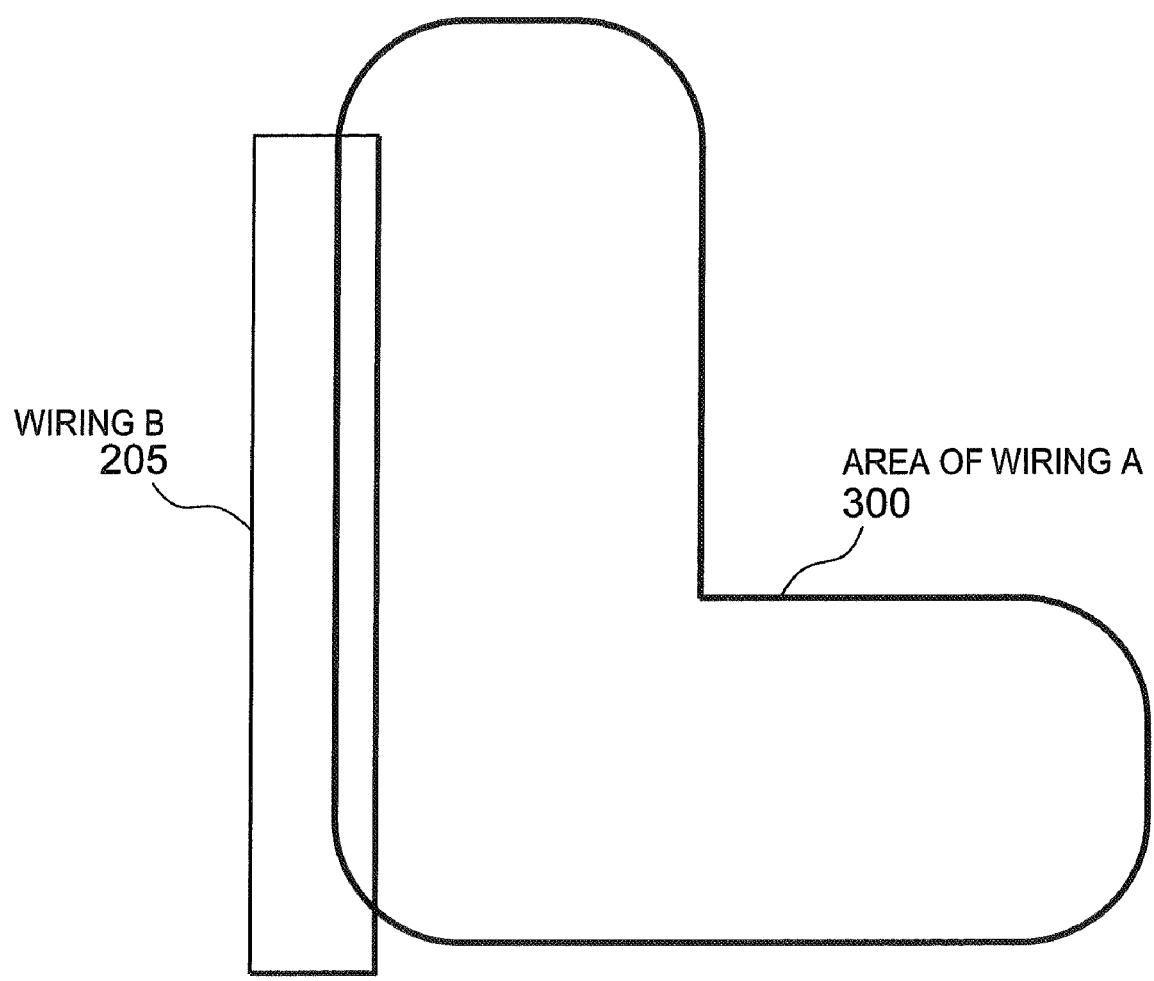
FIG. 3 is an explanatory diagram illustrating the first exemplary embodiment of the present invention.

The area generating element 13 generates an area indicative of a position apart from the wiring by a distance corresponding to the minimum clearance that is predetermined to the wiring. That is, this means that an arrangement of other wirings is prohibited within the area. The area generating element 13 acquires the polygon figure that the area is to be generated, the polygon figure is generated by the first calculating element 12, from the arrangement information storage element 21. The area generating element 13 can acquire the polygon figure that has been designated as an area generated object in advance by searching the polygon figure from the arrangement information storage element 21. Also, it is possible that the first calculating element 12 notifies the area generating element 13 of the wiring in which the error has been detected, and the area generating element 13 acquires the polygon figure of the notified wiring from the arrangement information storage element 12. The area generating element 13 generates the area with respect to the acquired polygon figure. FIG. 3 shows an example of the area that is generated by the area generating element 13. FIG. 3 shows an example of the area that is generated with respect to the wiring A (200) shown in FIG. 2. It can be recognized that the wiring B (205) is arranged within a range of the area 300 of the wiring A (200). In order to satisfy the design rule, the wiring B (205) can go out of the area 300 of the wiring A (200). In this way, the area 300 of the wiring A is generated, thereby making it possible to readily recognize how much the wiring B (205) is moved to satisfy the design rule. The generated area is displayed on the display device 30. The area generating element 13 stores the generated area in the area storage element 23.

The editing element 14 edits the information that is stored in the arrangement information storage element 21, the error figure storage element 22 and the area storage element 23. The editing element 14 acquires the polygon figure from the arrangement information storage element 21, the error figure from the error figure storage element 22, and the area from the area storage element 23, respectively. The editing element 14 generates a figure that the acquired polygon figure, the error figure and the area are superimposed on each other. The editing element 14 stores the generated figure in the arrangement information storage element 21. The figure that has been generated by the editing element 14 is displayed on the display device 30.

Figure 4:
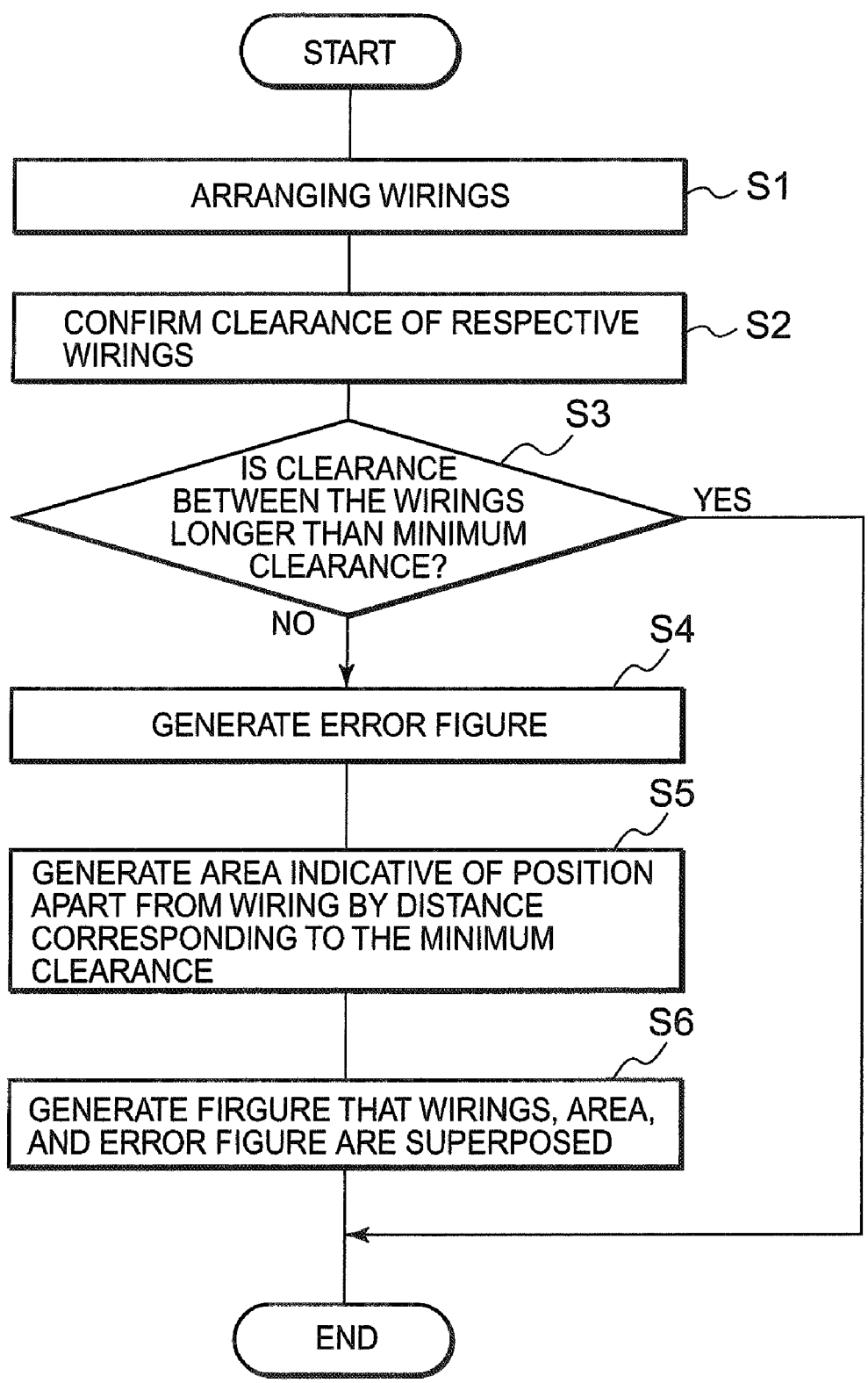
FIG. 4 is a flowchart showing the outline of the operation according to the first exemplary embodiment of the present invention.

Now, the summary of the operation according to the first exemplary embodiment will be described with reference to a flowchart shown in FIG. 4.

The arranging element 11 arranges the wirings (Step S1).

The first calculating element 12 checks the clearance between the respective wirings, and confirms whether there is the required clearance between the wirings, the required clearance is longer than the minimum clearance, or not (Step S2).

In the case where the clearance between the wirings are longer than the minimum clearance (yes in Step S3), the operation is terminated.

In the case where the clearance between the wirings are shorter than the minimum clearance (no in Step S3), the first calculating element 12 generates the error figure (Step S4).

The area generating element 13 generates the area indicative of the position apart from the wiring by the distance corresponding to the minimum clearance (Step S5).

The editing element 14 generates the figure that the wirings, the error figure and the area are superimposed on each other (Step S6).

Subsequently, the operation of generating the area by the area generating element 13 will be described in more detail.

Figure 5:
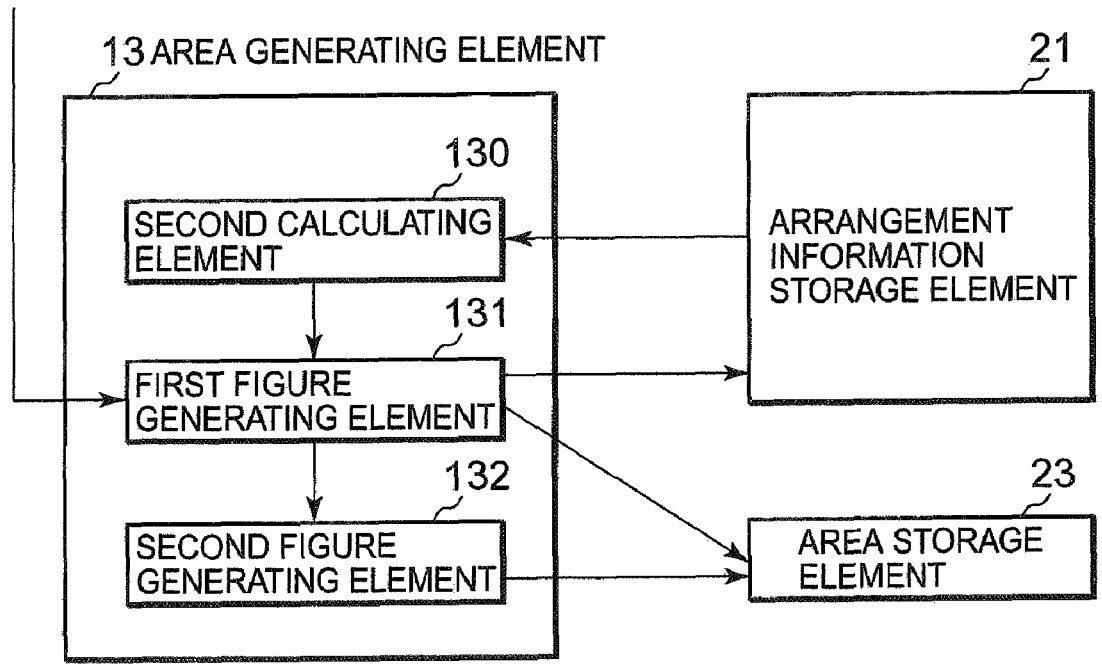
FIG. 5 is a block diagram illustrating the first exemplary embodiment of the present invention.

Referring to FIG. 5, the area generating element 13 includes a second calculating element 130, a first figure generating element 131, and a second figure generating element 132. The first figure generating element 131 is connected to the calculating element 12.

Figure 6:
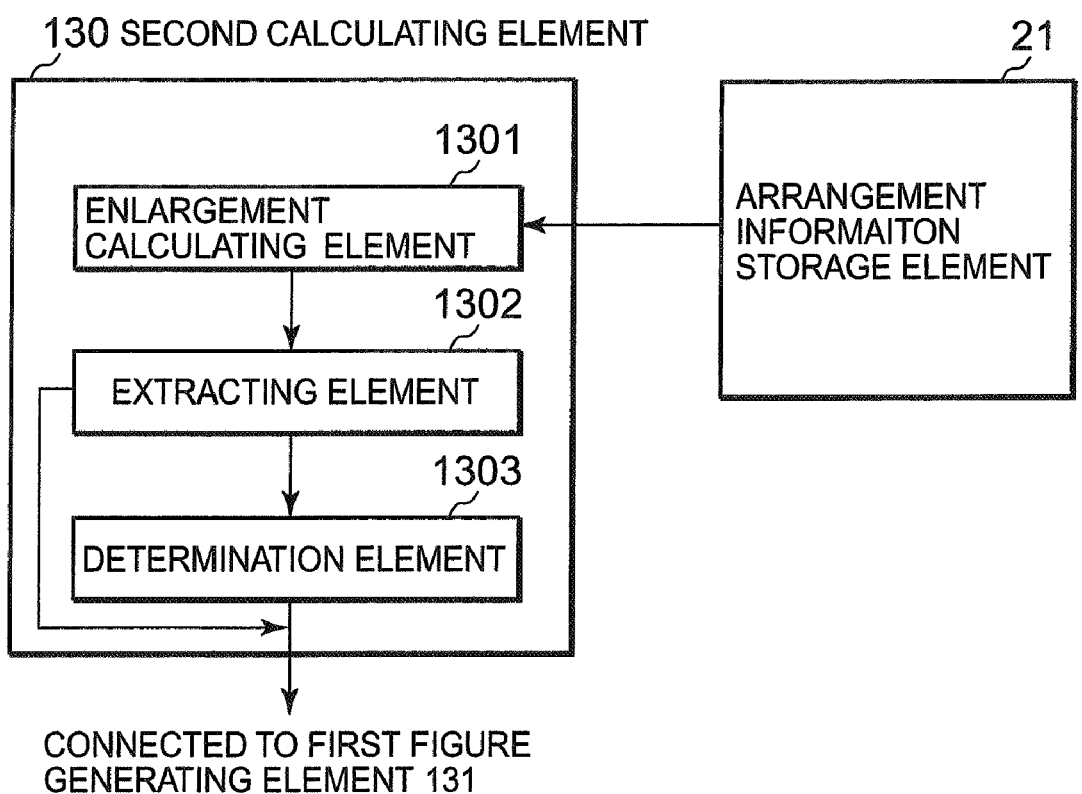
FIG. 6 is a block diagram illustrating the first exemplary embodiment of the present invention.

Referring to FIG. 6, the second calculating element 130 includes an enlargement calculating element 1301, an extracting element 1302 and determination element 1303. The determination element 1303 and the extracting element 1302 are connected to the first figure generating element 131.

Subsequently, a description will be given the operation of generating the area by the area generating element 13 with reference to examples shown in FIGS. 2, 3, 7, and 8.

As shown in FIG. 2, in the case where two of the wiring A (200) and the wiring B (205) are arranged, an example in which the area is generated with respect to the wiring A (200) will be described.

Figure 7:
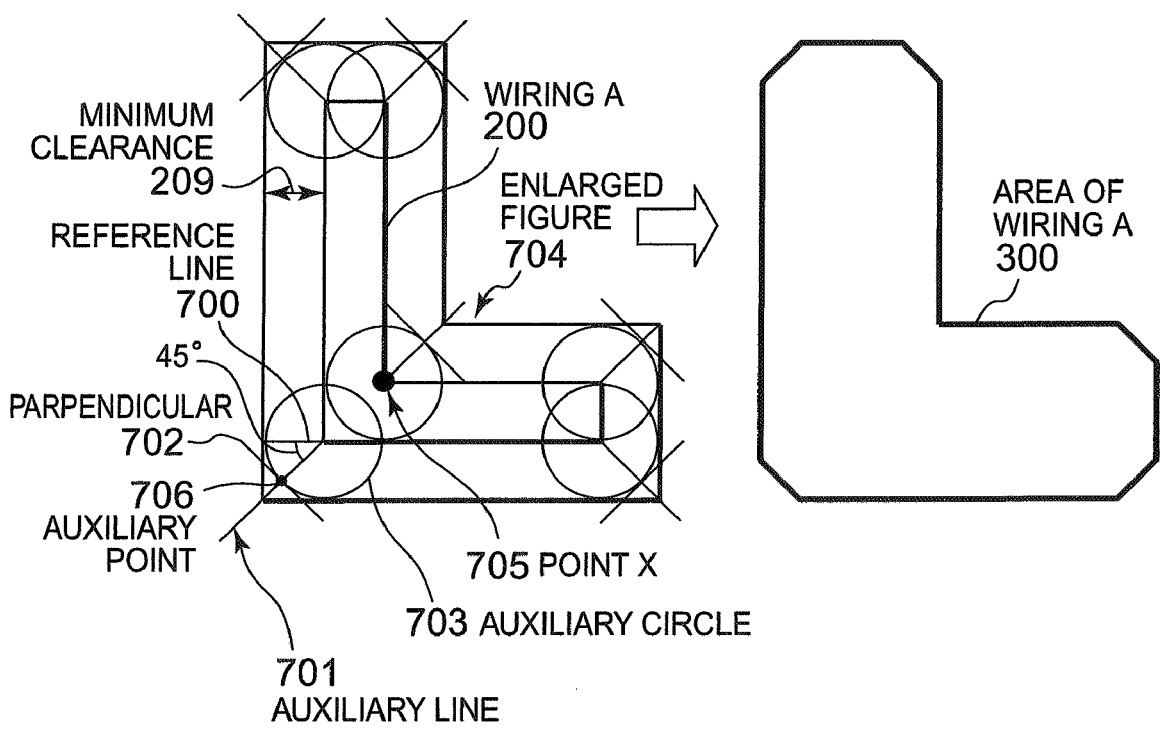
FIG. 7 is an explanatory diagram illustrating the first exemplary embodiment of the present invention.

Referring to FIG. 7, the description of the first figure generating element 131 will be made. The first figure generating element 131 acquires the polygon figure of the wiring A (200), the area is to be generated with respect to the wiring A (200), from the arrangement information storage element 21. The first figure generating element 131 generates an enlarged figure 704 that is obtained by enlarging the contour of the acquired polygon figure by the distance corresponding to the minimum clearance 209. Then, the first figure generating element 131 calculates the coordinates of the respective vertexes of the wiring A (200) The first figure generating element 131 selects one vertex, selects one side of the polygon figure of the wiring A (200) which crosses the selected vertex, and extends the selected side to generate a reference line 700. The length of the reference line 700 can be arbitrarily selected. The first figure generating element 131 generates the reference lines 700 with respect to all of the vertexes. Then, the first figure generating element 131 generates an auxiliary line 701 from each of the vertexes so as to define an angle of 45° with respect to the reference line 700. Also, the first figure generating element 131 generates an auxiliary circle 703. The center of the auxiliary circle 703 is each of the vertexes. The radius of the auxiliary circle 703 is the minimum clearance 209. The first figure generating element 131 obtains an auxiliary point 706 that is a cross point of the auxiliary circle 703 and the auxiliary line 701. It is possible that the first figure generating element 131 calculates a position on the auxiliary line 701 apart from the vertex by the distance corresponding to the minimum clearance 209 to obtain the auxiliary point 706. Then, the first figure generating element 131 generates a perpendicular line 702 that passes through the auxiliary point 706 and is perpendicular to the auxiliary line 701. The first figure generating element 131 calculates the coordinates of a cross point between the perpendicular line 702 and the enlarged figure 704. In the case where the position of the auxiliary point 706 is positioned inside of the enlarged figure 704 as indicated by a point X 705 shown in FIG. 7, the first figure generating element 131 does not calculate the coordinates of the cross point between the perpendicular line 702 and the enlarged figure 704. The first figure generating element 131 generates the figure that connects those coordinates of the cross point as the area 300 of the wiring A (200).

Figure 8:
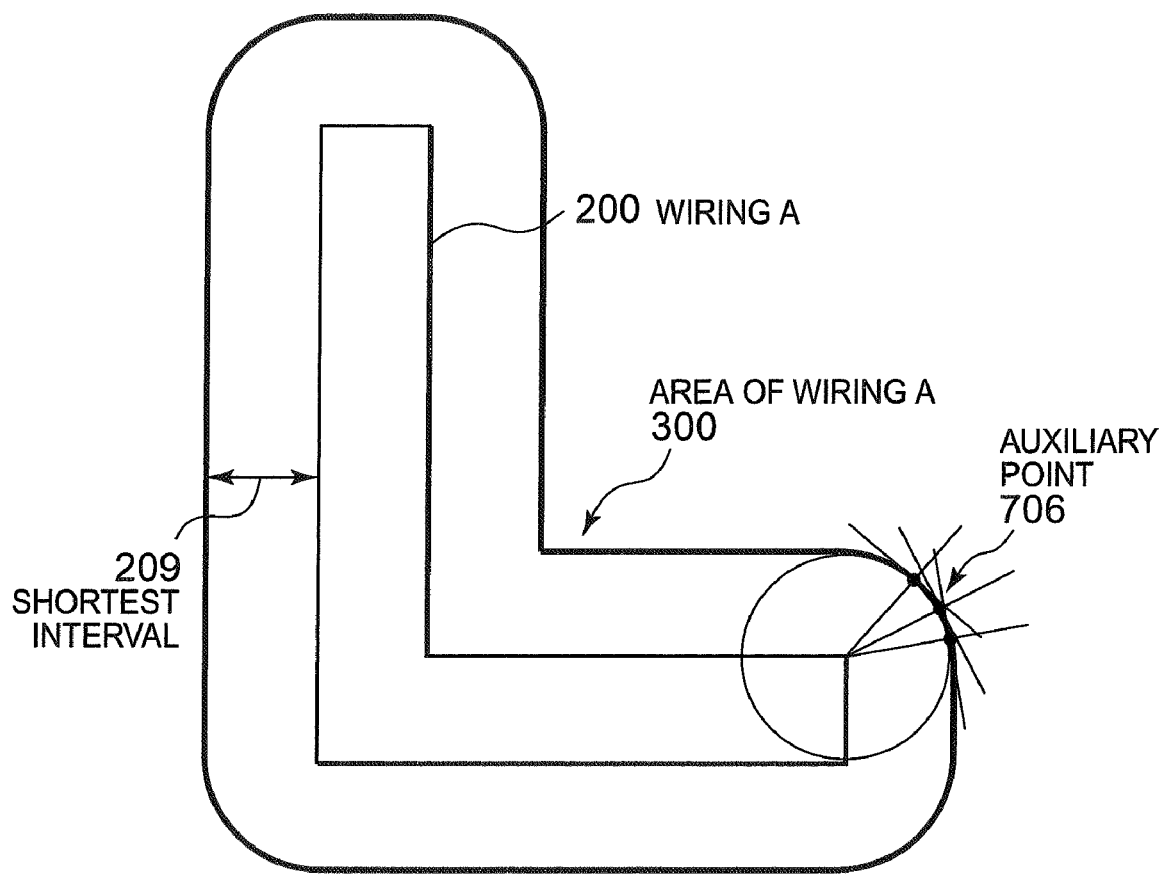
FIG. 8 is an explanatory diagram illustrating the first exemplary embodiment of the present invention.

Referring to FIG. 8, other operation of the first figure generating element 131 will be described.

In an example shown in FIG. 7, the first figure generating element 131 generates only the auxiliary line 701 that defines the angle of 45° with respect to the reference line 700. However, the first figure generating element 131 is capable of generating plural auxiliary lines 701 without generating the reference line 700 as in an example of FIG. 8. The first figure generating element 131 generates the perpendicular 702 with respect to each of the plural generated auxiliary lines 701. The first figure generating element 131 calculates the coordinates of the auxiliary points 706 that is the cross points of the auxiliary lines 701 and the perpendiculars 702. With the connection of those coordinates, the ends of the area 300 of the wiring A (200) approximate arcs. Since the ends of the area 300 of the wiring A (200) approximate the arcs, it is possible to more precisely recognize the position apart from the wiring A (200) by the distance corresponding to the minimum clearance 209.

Subsequently, the operation of the first figure generating element 131 will be described with reference to a flowchart shown in FIG. 9.

The first figure generating element 131 selects the wiring figure that the area is to be generated, and acquires the selected wiring figure from the arrangement information storage element 21 (Step S7).

The first figure generating element 131 enlarges the wiring figure by the distance corresponding to the minimum clearance 209 that is determined according to the design rule of the selected wiring figure to generate the enlarged figure (Step S8).

The first figure generating element 131 calculates the coordinates of each of the vertex of the wiring figure (Step S9).

The figure generating element 131 selects one arbitrary side from the sides that cross the vertex, and extends the selected side to generate the reference line (Step S10).

The first figure generating element 131 generates the auxiliary line from the vertex toward outside of the wiring figure (Step S11). The angle of the auxiliary line is 45 degree with respect to the reference line.

The first figure generating element 131 generates the perpendicular that passes through the position on the auxiliary line which is apart from the vertex by the distance corresponding to the minimum clearance (Step S12).

The first figure generating element 131 calculates the coordinates of the cross point between the perpendicular and the enlarged figure (Step S13).

The first figure generating element 131 confirms whether all of the vertexes of the wiring figure have been selected, or not (Step S14).

In the case where there exists an unselected vertex (no in Step S14), the first figure generating element 131 again executes the processing of Step S9 and the subsequent steps.

In the case where all of the vertexes are selected (yes in Step S14), the first figure generating element 131 connects the cross points that cross between the perpendicular and the enlarged figure, and generates the area (Step S15).

Figure 10:
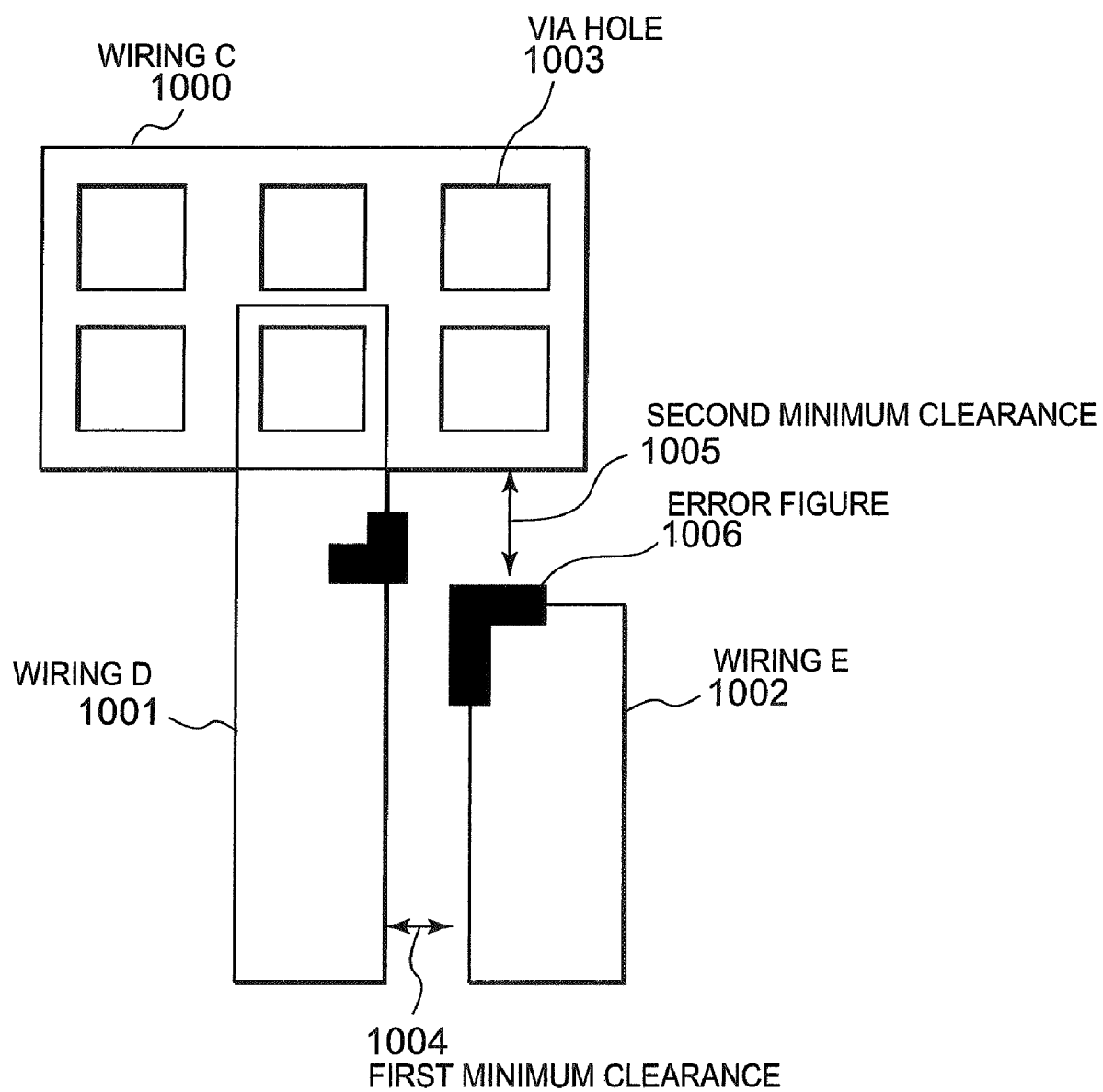
FIG. 10 is an explanatory diagram illustrating the first exemplary embodiment of the present invention.

Subsequently, a description will be given of the operation of the area generating element 13 in the case where the design rule of a wiring C (1000) having a thicker width is applied to a part of a wiring D (1001) having a thinner width in an arrangement where the wiring C (1000) of the thicker width and the wiring D (1001) of the thinner width are connected to each other as shown in FIG. 10. Referring to FIG. 10, the wiring C (1000) is a via cell having plural via holes 1003, for example. A required clearance between the wiring D (1001) and another wiring (for example, a wiring E (1002) in the figure) is determined as a first minimum clearance 1004 according to the design rule. Also, a required clearance between the wiring C (1000) and another wiring (for example, a wiring E (1002) in the figure) is determined as a second minimum clearance 1005 according to the design rule. The wiring C (1000) and the wiring D (1001) belong to a same net list. Also, the wiring E (1002) belongs to another net list different from the net list to which the wiring C (1000) and the wiring D (1001) belong. As shown in FIG. 10, the wiring E (1002) has a clearance larger than the first minimum clearance 1004 with respect to the wiring D (1001). Also, the wiring E (1002) has a clearance larger than the second minimum clearance 1005 with respect to the wiring C (1000). However, the error figure 1006 is displayed as shown in FIG. 10. This is because there is no clearance that is larger than the second minimum clearance 1005 with respect to a part of the wiring D (1001)to which the design rule of the wiring C is applied (1000).

In this case, before the first figure generating element 131 executes the area generating process, the second calculating element 130 executes the process. The second calculating element 130 checks whether the wiring figure of the thicker width is connected to at least one of the wirings which are an object of the error figure, or not, and in the case where the wiring figure of the thicker width is connected to that wiring, the process that will be described below is executed by the second calculating element 130. The first figure generating element 131 generates the area on the basis of the processing result of the second calculating element 130. Hereinafter, the second calculating element 130 will be described in more detail with reference to specific examples of FIGS. 10 to 14. As described above, the second calculating element 130 includes the enlargement calculating element 1301, the extracting element 1302, and the determination element 1303.

The enlargement calculating element 1301 acquires the polygon figure of the wiring C (1000) and the wiring D (1001) from the arrangement information storage element 21. The enlargement calculating element 1301 searches the wiring portion of the thicker width from the acquired polygon figure.

Figure 11:
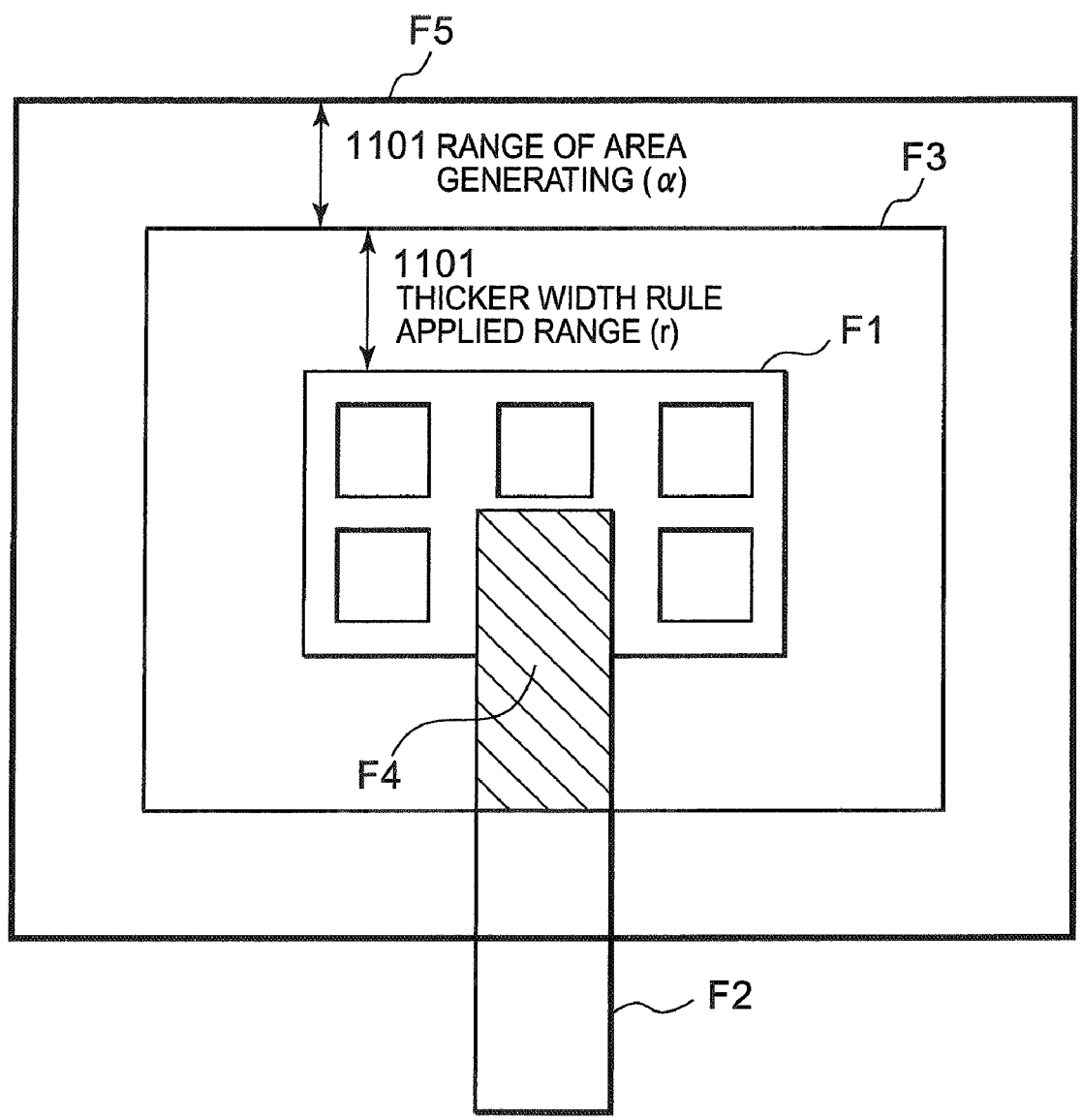
FIG. 11 is an explanatory diagram illustrating the first exemplary embodiment of the present invention.

The enlargement calculating element 1301 generates a figure obtained by enlarging the polygon figure of the wiring portion having the thicker width in order to determine a range to which the design rule of the thicker wiring is applied. Referring to FIG. 11, this operation will be described with reference to FIG. 11. Referring to FIG. 11, it is assumed that the wiring C (1000) of the thicker width is F1, and the wiring D (1001) of the thinner width is F2. The enlargement calculating element 1301 generates a figure F3 that is obtained by enlarging the polygon figure of F1 by a distance corresponding to a thicker width rule applied range (r) 1100. The thicker width rule applied range (r) 1100 is indicative of a range to which the design rule of F1 having the thicker width is applied. The enlargement calculating element 1301 calculates the thicker width rule applied range (r) 1100 on the basis of the design rule. The design rule of F1 is applied to the wiring that is arranged within the thicker width rule applied range (r), that is, a range indicated by F3.

The extracting element 1302 extracts a portion where F3 and F2 are overlapped on each other. In other words, the extracting element 1302 extracts a part of F2, the design rule of F1 is applied to the part of F2. As shown in FIG. 11, the part where F3 and F2 are overlapped each other is F4 indicated by a shaded portion of FIG. 11. The extracting element 1302 notifies the determination element 1303 of the extracted figure F4. The determination element 1303 determines that the design rule of F1 is applied to the part corresponding to the figure F4 which is notified from the extracting element 1302. Then, the determination element 1303 notifies the first figure generating element 131 that the design rule of F1 is applied to the F4, F4 is a part of F2.

After the extracting element 1302 extracts F4, the enlargement calculating element 1301 generates a figure F5 that is obtained by further enlarging F3 by a distance corresponding to a range of area generating (α) 1101. The range of area generating (α) 1101 indicates a range that the area is to be generated by the area generating element 130. That is, a certain part of F1 and F2 within the range of F5 is an object of area generation by the area generating element 130. It is possible that the value of α is arbitrarily set in the enlargement calculating element 1301 in advance.

Figure 12:
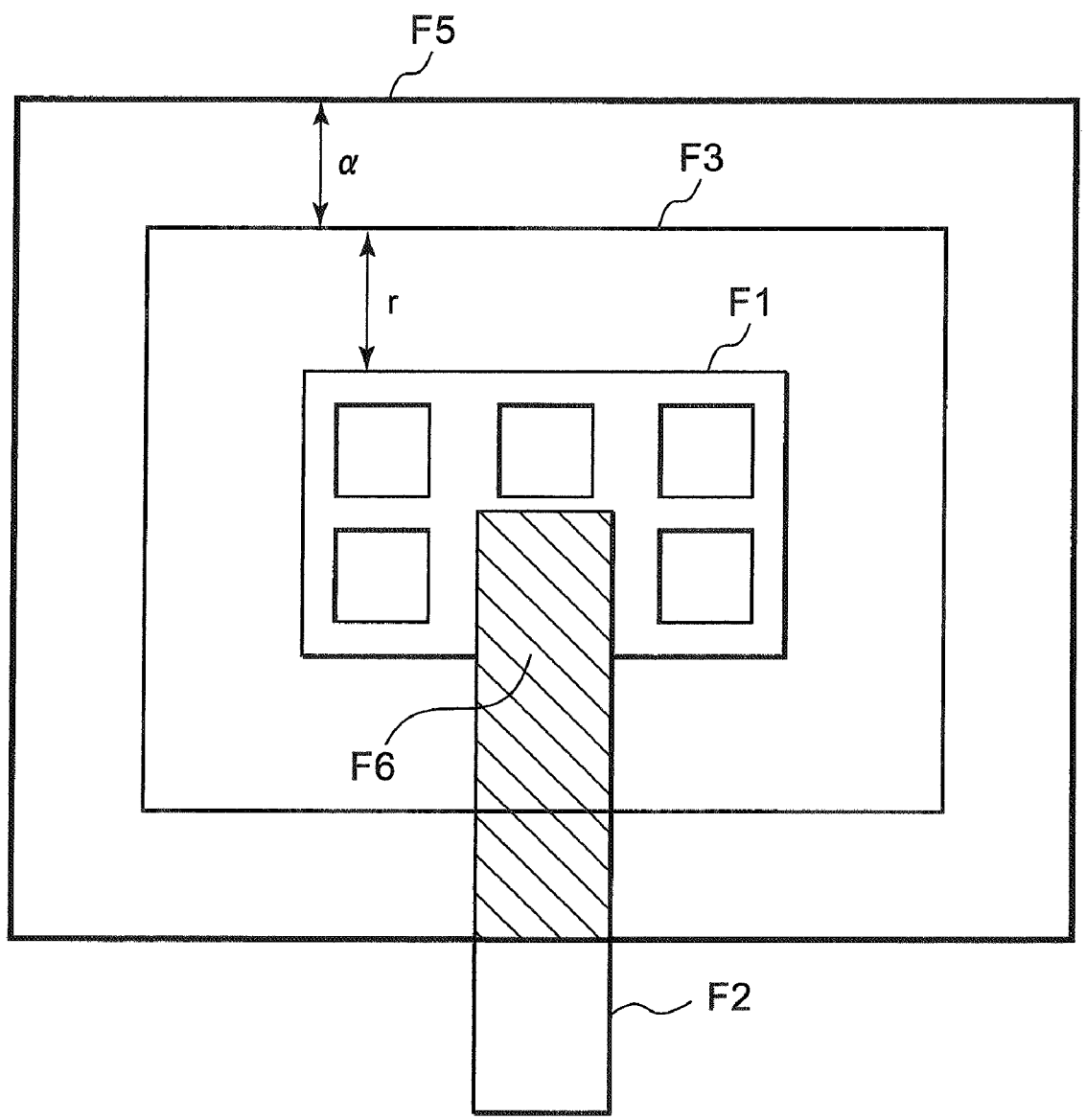
FIG. 12 is an explanatory diagram illustrating the first exemplary embodiment of the present invention.

The extracting element 1302 extracts a part of F2 which is overlapped F5. Referring to FIG. 12, it is found that a F6 indicated by a shaded portion in F2 overlaps with F5. The extracting element 1302 notifies the first figure generating element 131 that the F6 of F2 is the object of area generation. Since the entire portion of F1 overlaps with F5, it is unnecessary that the extracting element 1302 conducts the extracting process on F1.

Figure 13:
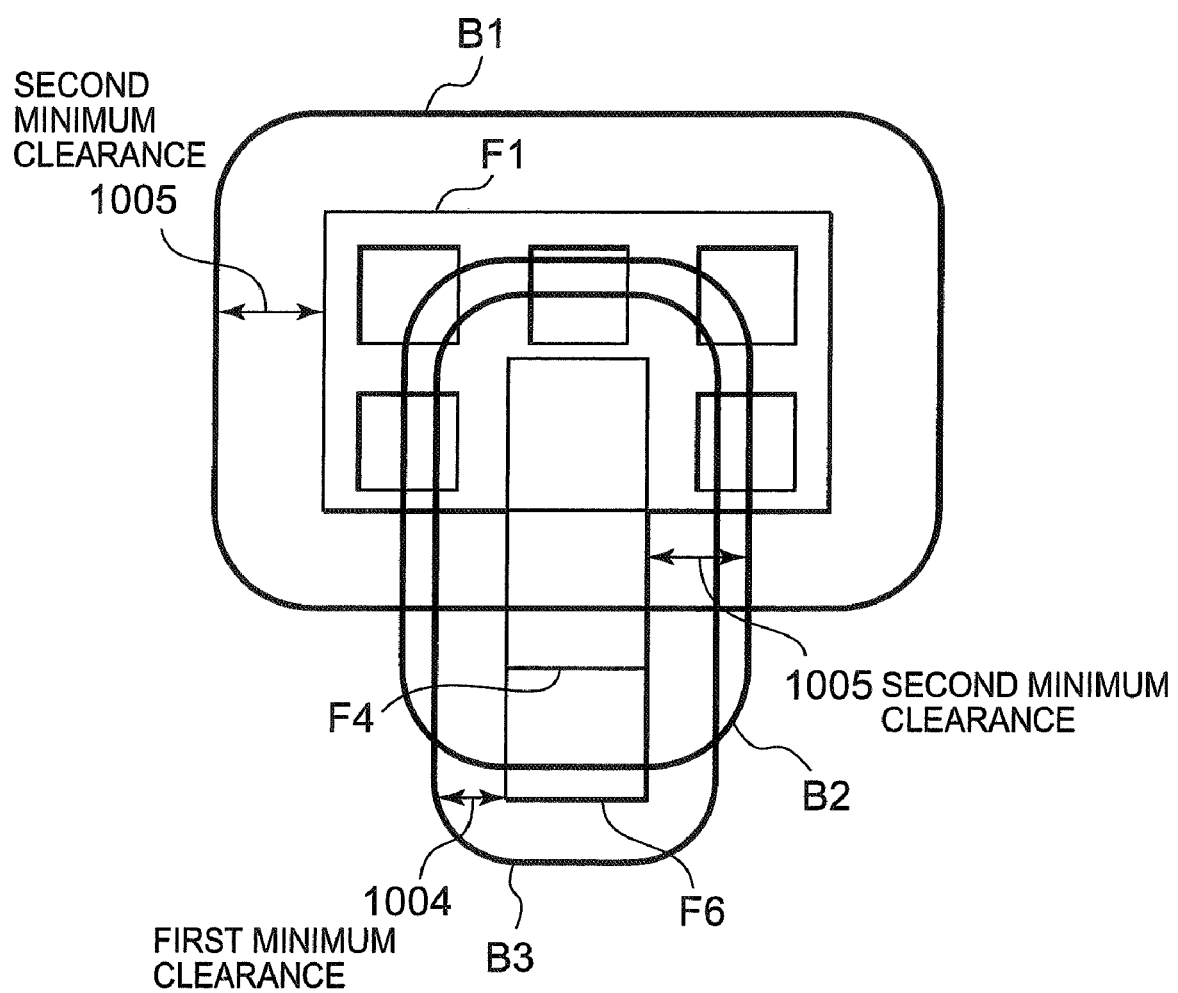
FIG. 13 is an explanatory diagram illustrating the first exemplary embodiment of the present invention.
Figure 14:
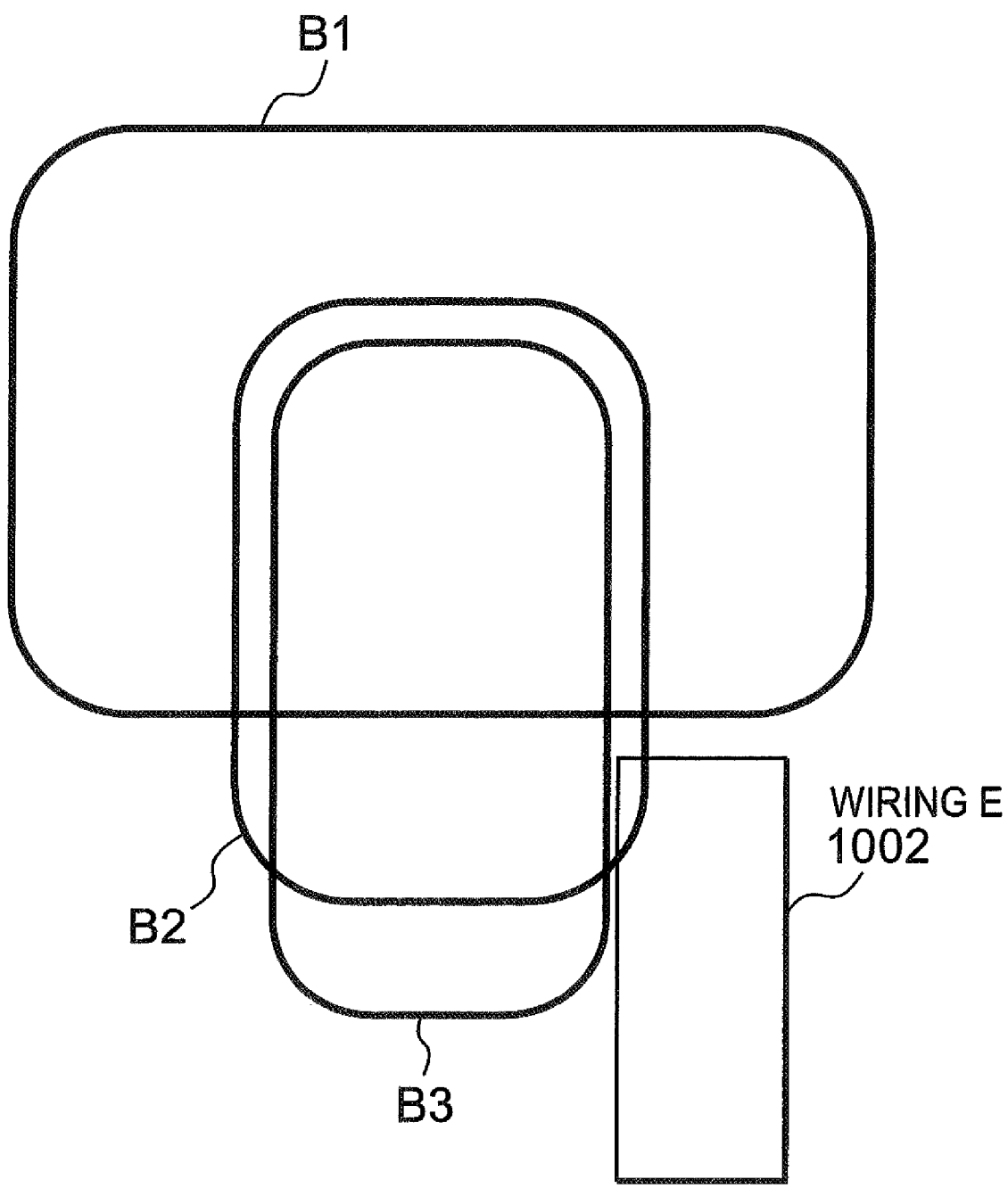
FIG. 14 is an explanatory diagram illustrating the first exemplary embodiment of the present invention.

Subsequently, the first figure generating element 131 generates the areas of F1, F4 and F6. As shown in FIG. 13, it is assumed that the area of F1 is B1, the area of F4 is B2, and the area of F6 is B3. B1 and B2 indicate positions apart from the wiring figures F1 and F4 by the distance corresponding to the second minimum clearance 1005. B3 indicates the position apart from the wiring figure F6 by the distance corresponding to the first minimum clearance 1004. The area generating process by the first figure generating element 131 is same as the process described with reference to the FIGS. 2, 3, 7, 8, and the flowchart of FIG. 9. In FIGS. 13 and 14, the first figure generating element 131 generates B1 and B2 separately. However, it is possible to generate one area that combines B1 and B2 together. The first figure generating element 131 conducts the logic operation OR on B1 and B2, thereby making it possible to generate two areas as one area.

FIG. 14 is a diagram in which the areas B1, B2, and B3 are displayed together with the wiring E (1002) having the error figure displayed. The wiring E (1002) does not exist within the range of B1 and B3. However, the wiring E (1002) exists within the range of B2. Hence, it can be determined that the wiring E (1002) violates the design rule. Also, it can be readily discriminated that how much the wiring E (1002) should be moved to eliminate the error.

Figure 15:
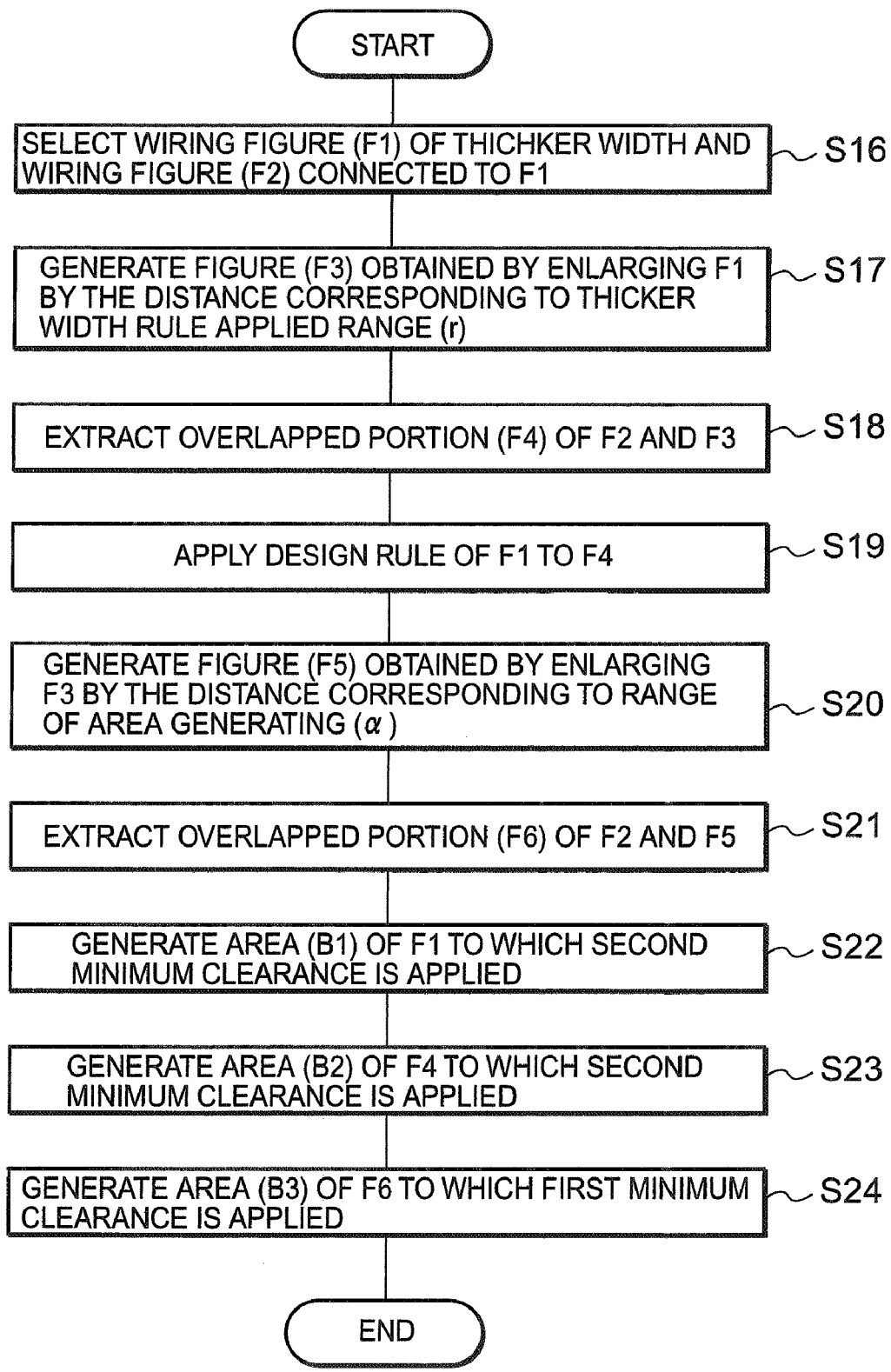
FIG. 15 is a flowchart for explaining the operation according to the first exemplary embodiment of the present invention.

Subsequently, a description will be given of the area generating operation in the case where the thicker wiring and the thinner wiring are connected to each other, and the design rule of the thicker wiring is applied to a part of the thinner wiring with reference to a flowchart shown in FIG. 15.

The enlargement calculating element 1301 selects the wiring figure F1 and F2, the wiring figure F2 is thinner in the wiring width than F1 and is connected to the thicker wiring figure F1 (Step S16).

The enlargement calculating element 1301 generates the figure F3 obtained by enlarging F1 by the distance corresponding to the thicker width rule applied range (r) (Step S17).

The extracting element 1302 extracts F4, F4 is a portion that F2 and F3 overlap (Step S18).

The determination element 1303 applies the design rule of F1 to F4 (Step S19).

The enlargement calculating element 1301 generates the figure F5 obtained by enlarging F3 by the distance corresponding to the range of area generating (α) (Step S20).

The extracting element 1302 extracts F6, F6 is a portion that F2 and F5 overlap (Step S21).

The first figure generating element 131 generates the area B1 of F1 to which the second minimum clearance 1005 is applied (Step S22).

The first figure generating element 131 generates the area B2 of F4 to which the second minimum clearance 1005 is applied (Step S23).

The first figure generation portion 131 generates the area B3 of F6 to which the first minimum clearance 1004 is applied (Step S24).

Figure 9:
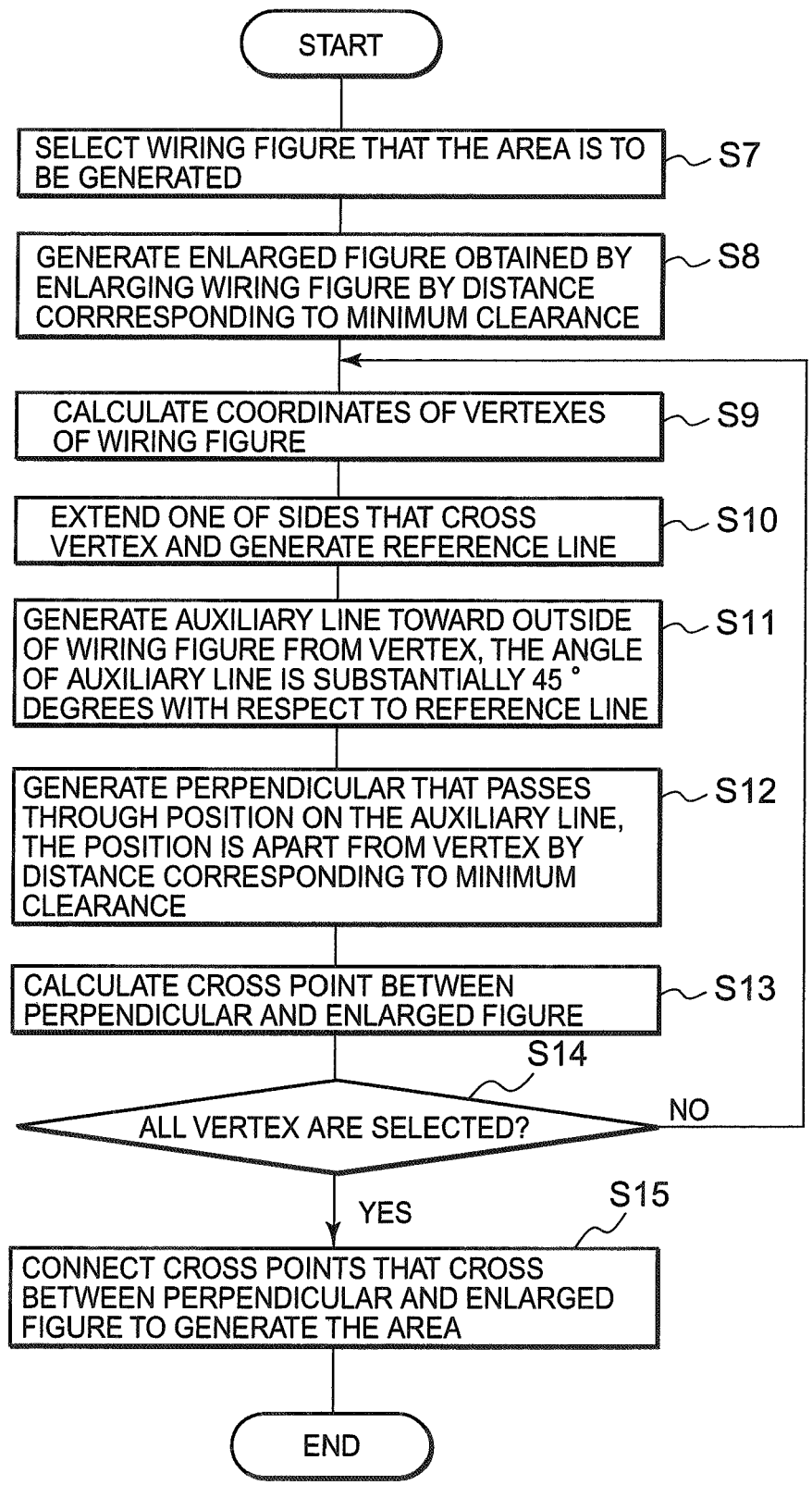
FIG. 9 is a flowchart for explaining the operation according to the first exemplary embodiment of the present invention.

The area generating process in Steps S22 to S24 by the first figure generating element 131 is identical with the process described in Steps S8 to S15 of FIG. 9.

Subsequently, a description will be given of the second figure generating element 132 that is a part of the area generating element 13.

Figure 16:
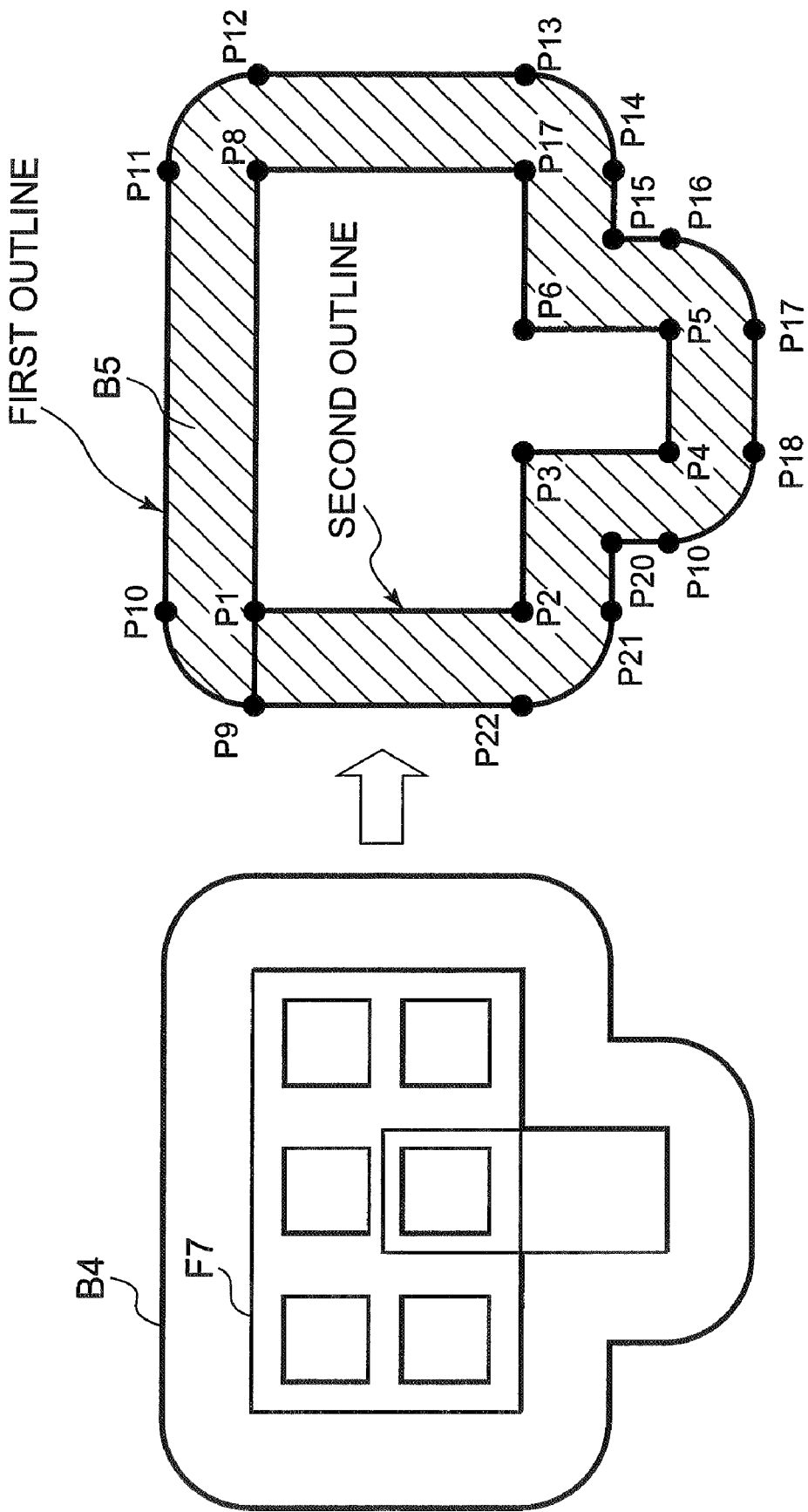
FIG. 16 is an explanatory diagram illustrating the first exemplary embodiment of the present invention.

The second figure generating element 132 generates a figure obtained by removing the wiring portion, the wiring portion is an object of the area generating process, from the area which is generated by the first figure generating element 131. The second figure generating element 132 will be described with reference to FIG. 16. F7 of FIG. 16 is a wiring figure that combines F1 and F4 shown in FIG. 11 together. Also, B4 in FIG. 16 is a wiring figure that combines B1 and B2 shown in FIG. 11 together. The second figure generating element 132 generates an area figure B5 (a shaded figure in FIG. 16) that results from removing a portion corresponding to F7 from B4. B5 includes a first outline corresponding to a position apart form F7 by a distance corresponding to a minimum clearance applied to F7. Also, B5 includes a second outline corresponding to an outline of F7.

The second figure generating element 132 acquires the polygon figure F7, F7 is obtained by combining F1 and F4 together, from the first figure generating element 131. Also, the second figure generating element 132 acquires the figure B4, the figure B4 is obtained by combining B1 and B2 together, from the first figure generating element 131. The second figure generating element 132 superimposes F7 and B4 at a regular position. The superimposition at the regular position means that F7 and B4 are superimposed on each other so that the a distance between the contour of F7 and the area B4 becomes the second minimum clearance 1005 at all positions of the contour of the wiring figure F7. Thereafter, the second figure generating element 132 extracts the coordinates of all the vertexes of F7 and B4. The vertexes which are extracted by the second figure generating element 132 include the auxiliary point 706 shown in FIGS. 7 and 8. In this situation, the second figure generating element 132 numbers the vertexes of the figure inside of the superimposed two figures. For example, as shown in FIG. 16, the second figure generating element 132 numbers the respective vertexes of F7 as P1, P2, . . . , P8. The second figure generating element 132 selects an arbitrary vertex as a start point (P1), and numbers the respective vertexes in order from the start point. The second figure generating element 132 assigns a next number to a vertex adjacent to the start point (P1), and thereafter assigns numbers to the adjacent vertexes in turn. Then, the second figure generating element 132 connects the respective vertexes in order of the number of vertexes. Referring to an example of FIG. 16, the second figure generating element 132 connects the respective vertexes in the order of P1, P2, P3, . . . , P8, and P1. When P8 and P1 are connected to each other to make a circuit of the contour of F7, the second figure generating element 132 extends a side that connects P1 and P8, and calculates the coordinates at a cross point between the side and B4. The second figure generating element 132 numbers the respective vertexes of the outside figure of the superimposed two figures in order. The outside is the area B4. In the example of FIG. 16, since the vertexes of F7 are numbered up to P8, the vertexes of B4 are numbered from P9 in order. The second figure generating element 132 connects P1 and P9, and then connects the respective vertexes in order of P9, P10, . . . P22, and P9. Finally, the second figure generating element 132 draws a line from P9 to P1 to connect P9 and P1. As a result, a new polygon figure B5 (a shaded portion of FIG. 16) is generated. In other words, the polygon figure B5 is obtained by removing a portion corresponding to the polygon figure of the wiring figure F7 from the polygon figure of the area B4.

Figure 17:
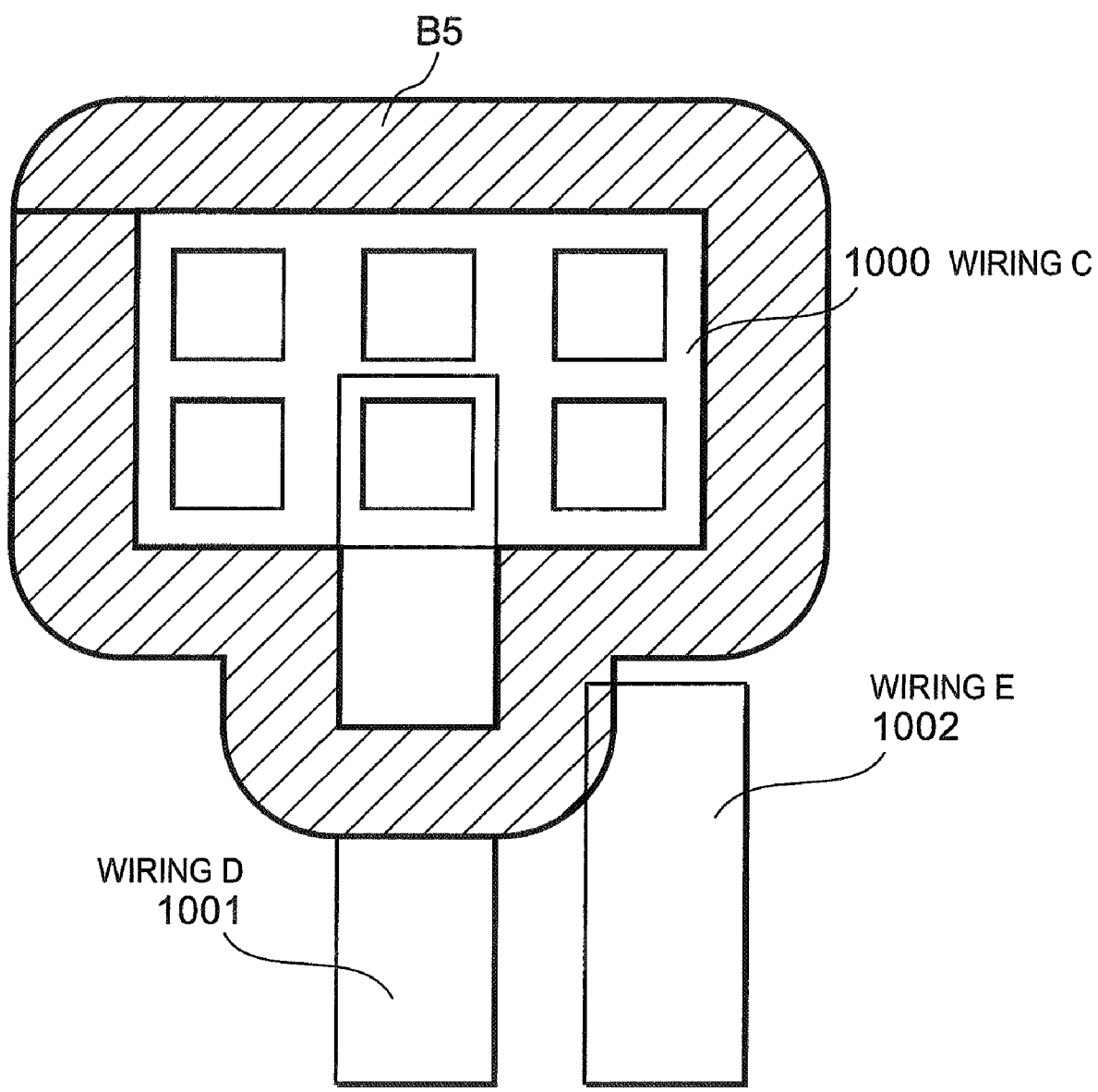
FIG. 17 is an explanatory diagram illustrating the first exemplary embodiment of the present invention.

FIG. 17 shows a figure in which the wiring C (1000), the wiring D (1001), and the wiring E (1002) shown in FIG. 10 are superimposed on B5. Because the portion corresponding to the wiring figure is removed from B1, it is possible to display both of the area (B5) and the wiring figure (wiring C, D and E).

Figure 18:
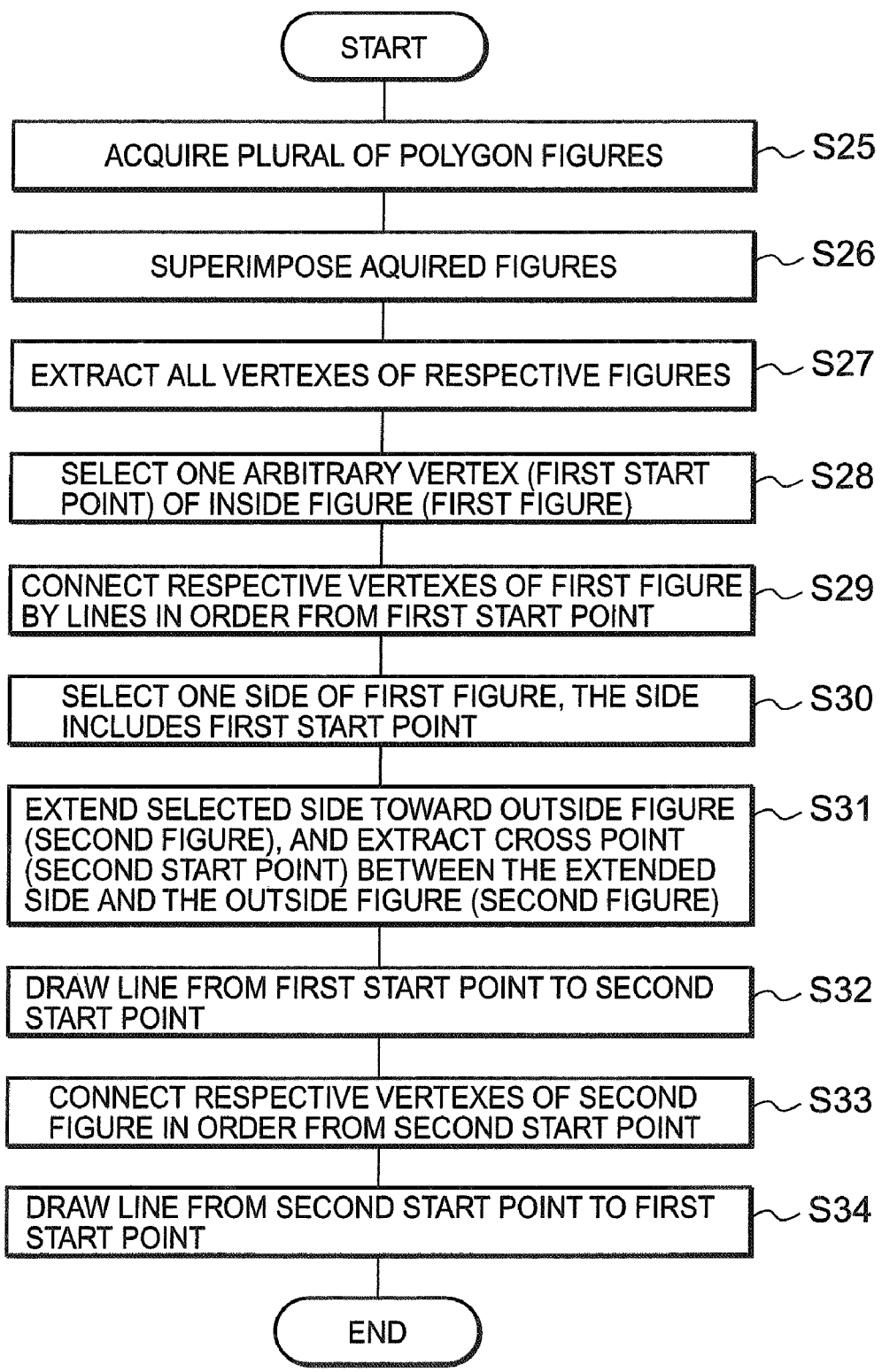
FIG. 18 is a flowchart for explaining the operation according to the first exemplary embodiment of the present invention.

Subsequently, the operation of the second figure generating element 132 will be described with reference to a flowchart of FIG. 18.

The second figure generating element 132 acquires the polygon figure of the wiring and the polygon figure of the area from the first figure generating element 131 (S25).

The second figure generating element 132 superimposes the polygon figure of the wiring and the polygon figure of the area at a regular position (Step S26).

The second figure generating element 132 extracts all the vertexes of the respective figures (Step S27). The vertexes which are extracted by the second figure generating element 132 include the auxiliary point 706 shown in FIGS. 7 and 8.

The second figure generating element 132 selects one arbitrary vertex (first start point) of the inside polygon figure (first figure) of the superimposed figures (Step S28).

The second figure generating element 132 connects the respective vertexes of the first figure by lines in the order from the first start point (Step S29).

The second figure generating element 132 selects one side of the first figure, the side includes the first start point (Step S30).

The second figure generating element 132 extends the selected side toward the outside figure (second figure), and calculates the coordinates of a cross point (second start point) between the extended side and the second figure (Step S31).

The second figure generating element 132 draws a line from the first start point to the second start point to connect those start points (Step S32).

The second figure generating element 132 connects the respective vertexes of the second figure by lines in order from the second start point (Step S33).

The second figure generating element 132 draws a line from the second start point to the first start point to connect both of those points (Step S34).

Since the area is generated, a place where other wirings cannot be arranged is definite, and the efficiency of the operation of editing the wiring arrangement for correcting the error is remarkably improved.

Also, even in the case where the thicker wiring and the thinner wiring are connected to each other, and the design rule of the thicker wiring is applied to a part of the thinner wiring, the area can be generated. Therefore, even in case where the design rule of the thicker wiring is applied to the portion of the thinner wiring, the place where other wirings cannot be arranged is definite. As a result, it can be clearly discriminated how much the error wiring arrangement is moved in which direction in order to dispose the wiring outside of the area, and the efficiency of the error correcting operation is remarkably improved.

Figure 19:
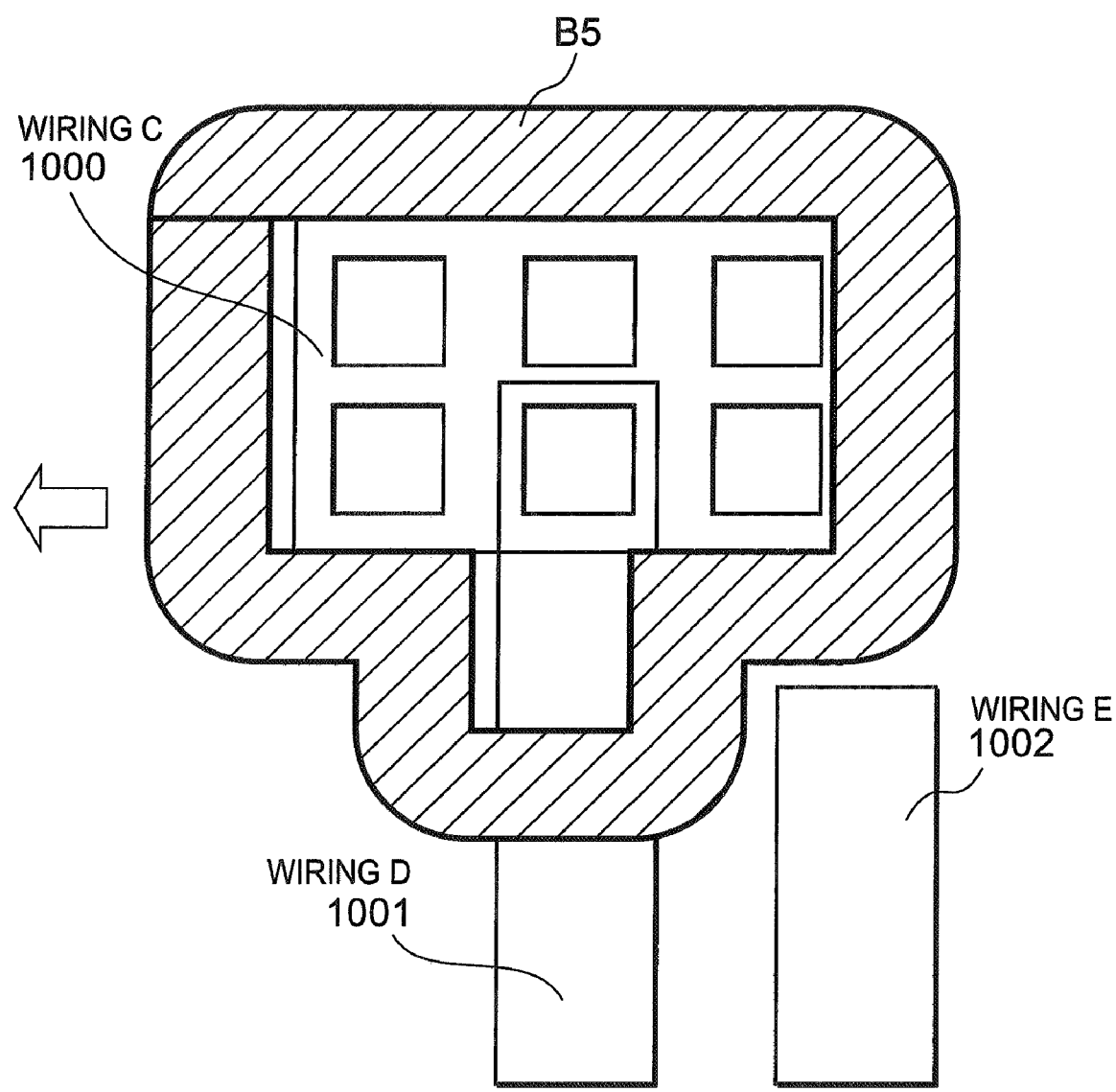
FIG. 19 is an explanatory diagram illustrating the first exemplary embodiment of the present invention.

In addition, the area that the portion corresponding to the wiring figure is removed can be generated. Hence, both of the area and the wiring figure that exists under that area can be display together. As a result, B5 is moved in the left direction of the drawing as shown in FIG. 19, thereby making it possible to further readily confirm how much the wiring C (1000) and the wiring D (1001) are moved in order to eliminate the error. Accordingly, there is obtained such an excellent advantage that the efficiency of the error correcting operation is further improved.

Subsequently, a second embodiment of the present invention will be described.

The second exemplary embodiment is different from the first exemplary embodiment in the operation of determining the portion of the thinner wiring to which the design rule of the thicker wiring is applied. In the following description, only portions that are different from the first exemplary embodiment will be described. Other portions are identical with those in the first exemplary embodiment, and therefore their description will be omitted.

A second exemplary embodiment will be described with reference to FIGS. 20 to 24.

Figure 20:
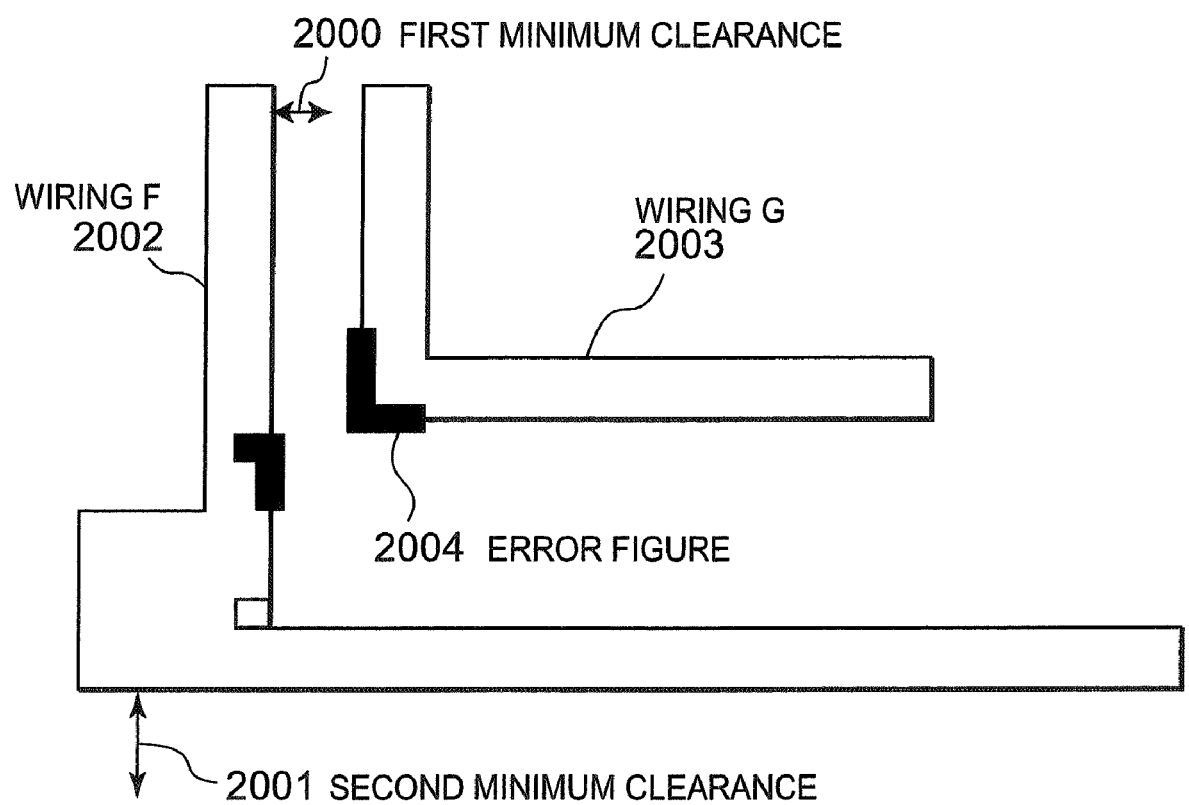
FIG. 20 is an explanatory diagram illustrating a second exemplary embodiment of the present invention.
Figure 21:
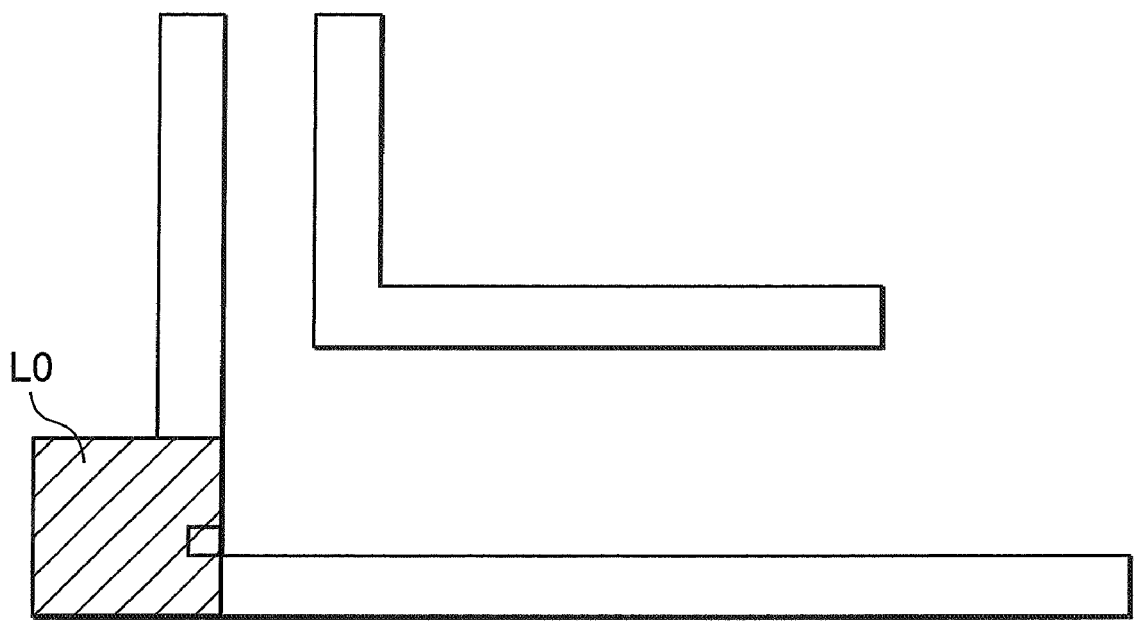
FIG. 21 is an explanatory diagram illustrating the second exemplary embodiment of the present invention.
Figure 22:
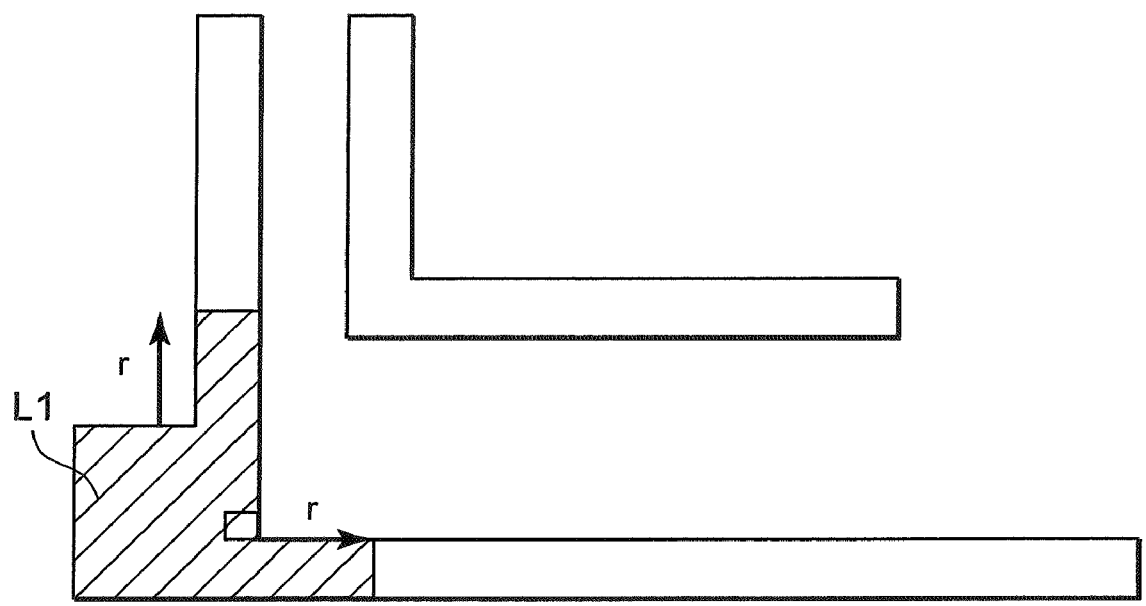
FIG. 22 is an explanatory diagram illustrating the second exemplary embodiment of the present invention.

As shown in FIG. 20, a specific example in which a wiring F (2002) having a thicker width portion in a part of a thinner wiring and a wiring G (2003) having a thinner width are arranged will be described. A first minimum clearance 2000 is a design rule that is applied to the wiring of the thinner width, which is a required clearance between the thinner wiring and another wiring. Also, a second minimum clearance 2001 is a design rule that is applied to the wiring of the thicker width, which is the required clearance between that thicker wiring and another wiring. It appears that the wiring F (2002) and the wiring G (2003) satisfy both conditions of the first minimum clearance 2000 and the second minimum clearance 2001. However, an error figure is displayed. This is because the design rule of the thicker width portion is applied to a part of the thinner width portion of the wiring F (2002), and a distance between the wiring G and the thinner wiring portion of the wiring F is narrower than the second minimum clearance 2001.

The enlargement calculating element 1301 searches a portion of the wiring F (2002) of which wiring width is thicker, and acquires an area L0 of the thicker portion. A shaded portion of FIG. 21 indicates an area L0 of the thicker width portion. Thereafter, the enlargement calculating element 1301 enlarges L0 by the distance corresponding to the thicker width rule applied range (r) to generate the area L1 shown in FIG. 22. The enlargement calculating element 1301 does not uniformly enlarge the entire L0. L1 generated by enlarging L0 by means of the enlargement calculating element 1301 is indicated by a shaded portion in FIG. 22. The enlargement calculating element 1301 enlarges L0 with respect to only the thinner width portion of the wiring F (2002) by the distance corresponding to r. In other words, the enlargement calculating element 1301 contiguously enlarges L0 with respect to the thinner width portion. As a result, because a part of the wiring G (2003) which is different from the wiring F (2002) is not included in the figure having the enlarged L0, it is possible to precisely specify the portion to which the design rule of the thicker width is applied.

The extracting element 1302 extracts the portion L2, L2 is obtained by removing L0 from L1, and notifies the determination element 1303 of the extracted portion L2. The determination element 1303 determines that the second minimum clearance 2001 is applied to the portion of L2, and notifies the first figure generating element 131 of the result of the determination. Shaded areas of FIG. 23 indicate L2.

Figure 23:
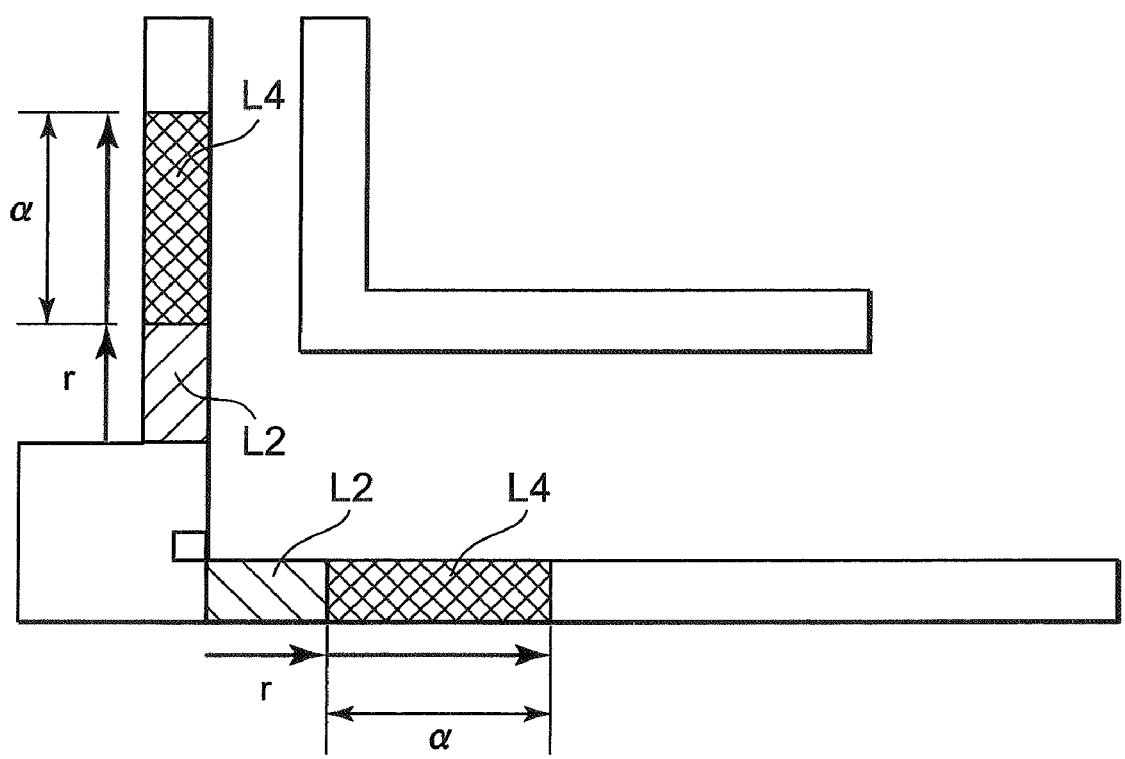
FIG. 23 is an explanatory diagram illustrating the second exemplary embodiment of the present invention.

The enlargement calculating element 1301 further contiguously enlarges L2 with respect to the thinner width portion of the wiring F by the distance corresponding to the range of area generating (α) to generate the area L3 (not shown in FIG. 23).

The extracting element 1302 extracts a portion L4, L4 is obtained by removing L2 from L3, and notifies the first figure generating element 131 that L4 is an object for area generating. Meshed areas in FIG. 23 indicates L4.

Figure 24:
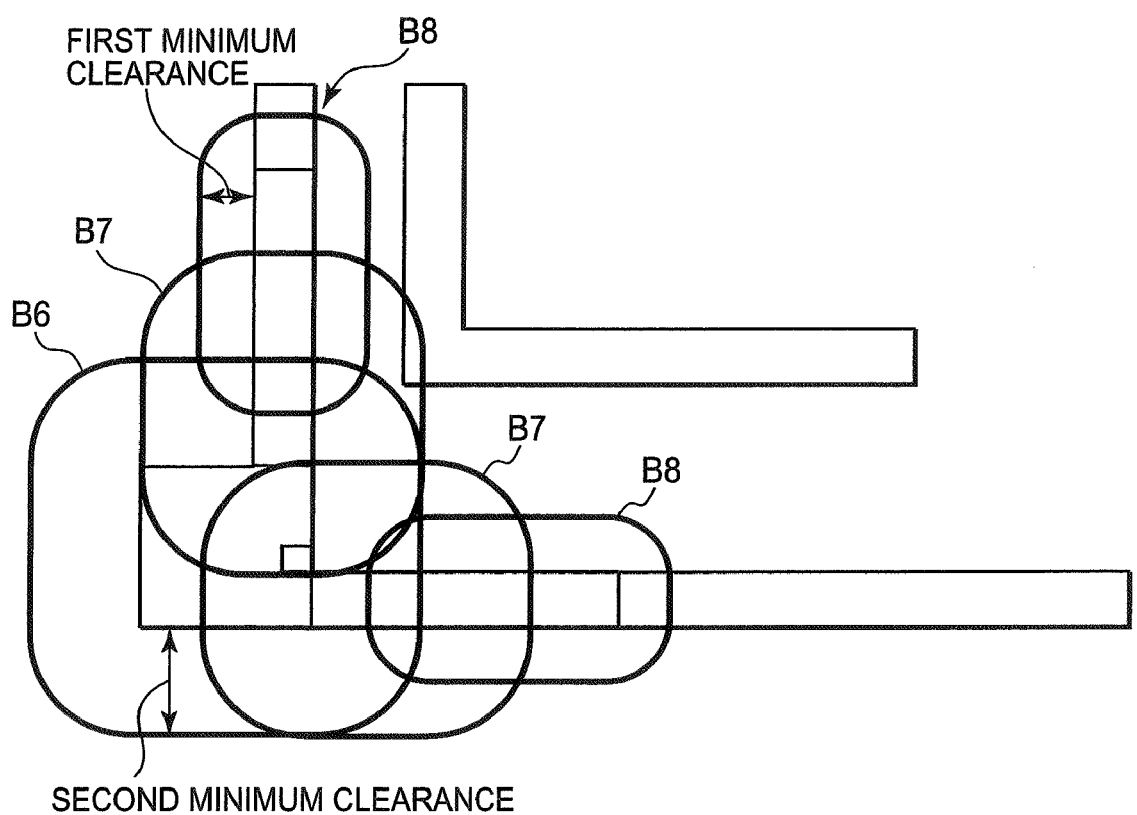
FIG. 24 is an explanatory diagram illustrating the second exemplary embodiment of the present invention.

The first figure generating element 131 generates the area figures with respect to L0, L2, and L4. FIG. 24 shows areas that are generated by the first figure generating element 131. The area of L0 corresponds to B6, the area of L2 corresponds to B7, and the area of L4 corresponds to B8. B6 and B7 are generated on the basis of the second minimum clearance 2001, and B8 is generated on the basis of the first minimum clearance 2000. FIG. 24 shows a diagram in which the wiring F (2002), the wiring G (2003), the areas B6, B7 and B8 are superimposed. The first figure generating element 131 is capable of generating the figure into which the L0 and L2 are combined together, that is, the area of L1. In this case, the generated area is of the configuration of combining B6 and B7 together.

Figure 25:
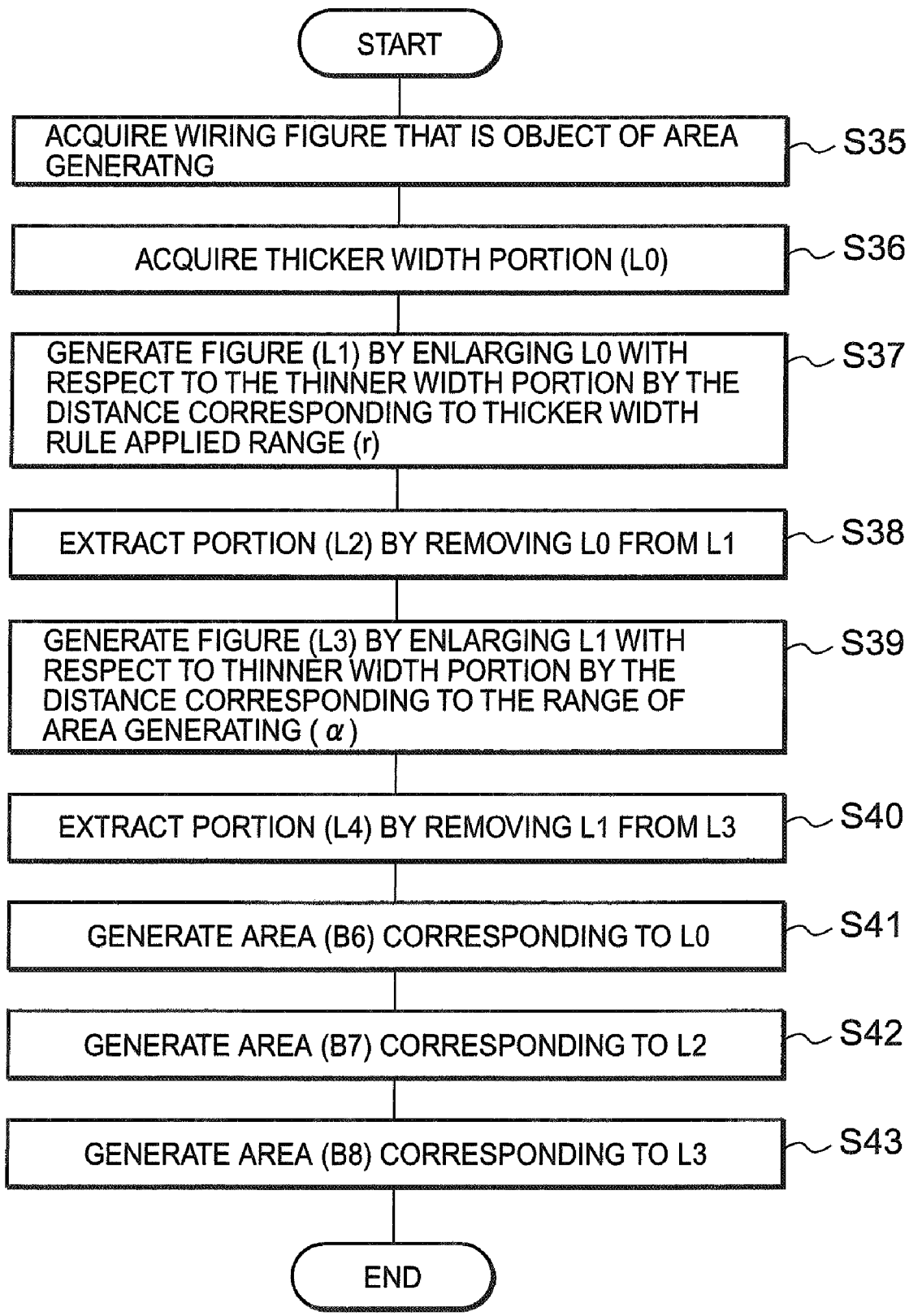
FIG. 25 is a flowchart for explaining the operation according to the second exemplary embodiment of the present invention.
Figure 26:
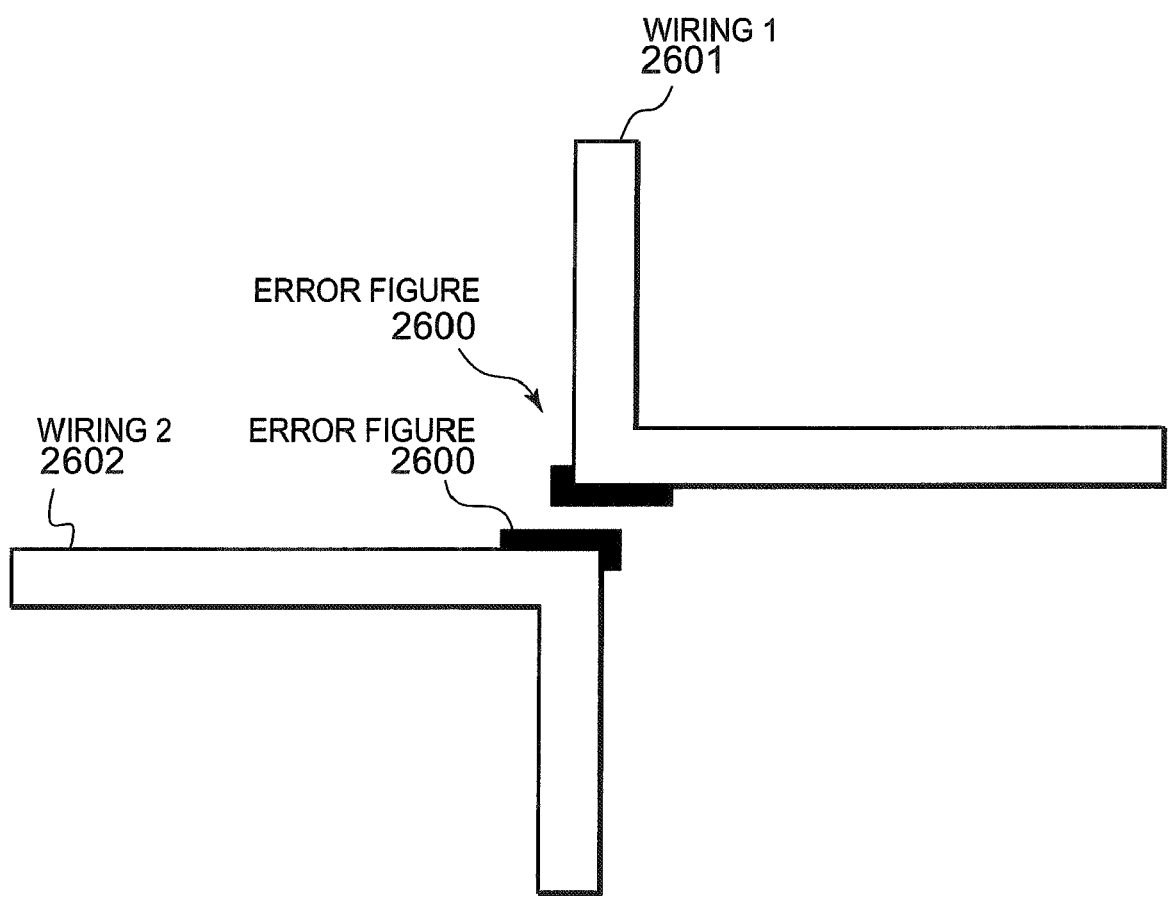
FIG. 26 is an explanatory diagram showing the related art.
Figure 27:
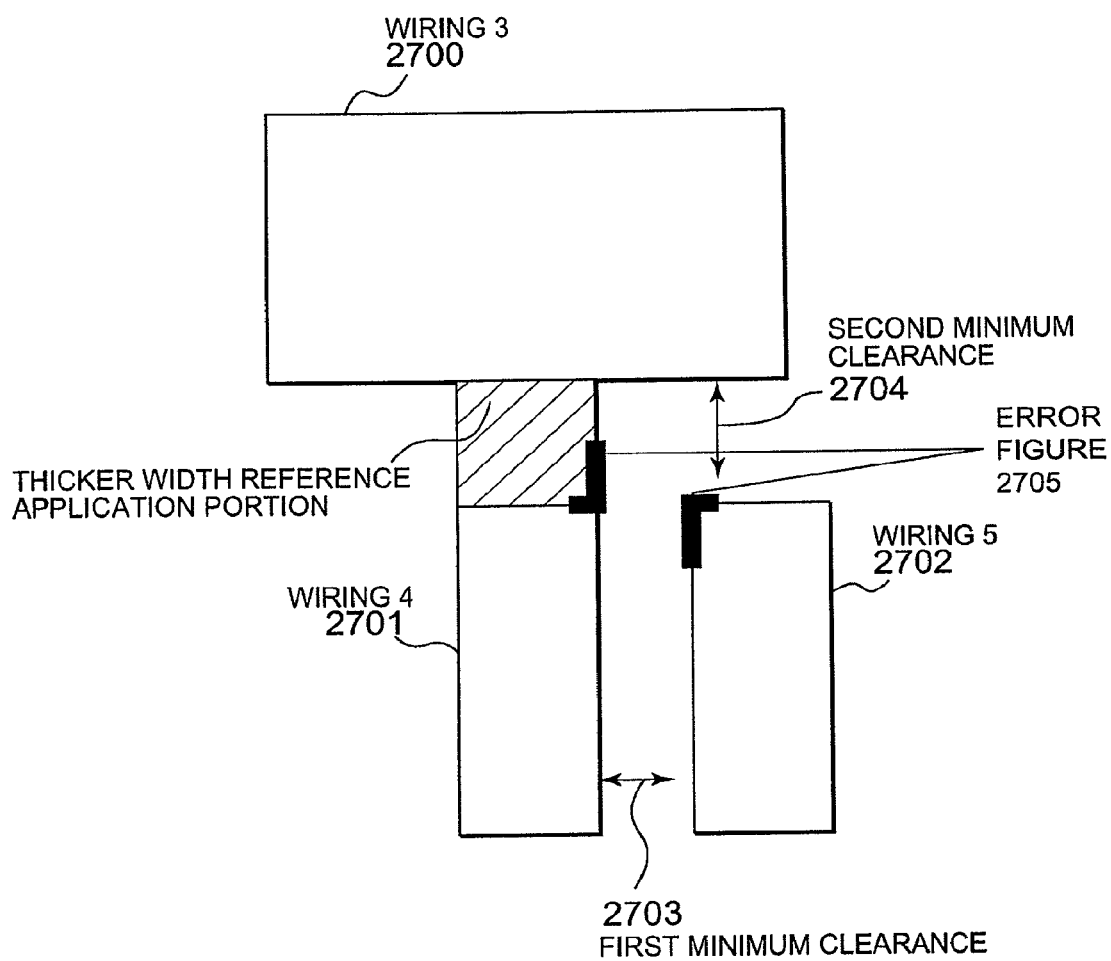
FIG. 27 is an explanatory diagram showing the related art.

Subsequently, the operation of the second exemplary embodiment will be described with reference to the flowchart shown in FIG. 25.

The enlargement calculating element 1301 acquires the wiring figure that is the object of area generating (Step S35) The enlargement calculating element 1301 acquires the thicker width portion (L0) of the wiring figure that is the object of area generating (Step S36).

The enlargement calculating element 1301 generates the figure (L1) contiguously enlarging L0 with respect to the thinner width portion by the distance corresponding to the thicker width rule applied range (r) (Step S37).

The extracting element 1302 extracts the portion (L2) by removing L0 from L1 (Step S38).

The enlargement calculating element 1301 generates the figure (L3) by contiguously enlarging L1 with respect to the thinner width portion by the distance corresponding to the range of area generating (α) (Step S39).

The extracting element 1301 extracts the portion (L4) by removing L1 form L1 (S40).

The first figure generating element 131 generates the area (B6) corresponding to L0, the minimum clearance for the thicker width wiring is applied to the area (B6) (Step S41).

The first figure generating element 131 generates the area (B7) corresponding to L2, the minimum clearance for the thicker width wiring is applied to the area (B7) (Step S42).

The first figure generating element 131 generates the area (B8) corresponding to L4, the minimum clearance for the thinner width wiring is applied to the area (B8) (Step S43).

The process for generating the areas in Steps D41 to S43 by means of the first figure generating portion 131 is identical with the process described in Steps S8 to S15 in FIG. 9.

In the second exemplary embodiment, the enlargement calculating element 1301 enlarges the figure of the thicker width portion of the wiring with respect to only the portion of the thinner width wiring. Hence, there is obtained such an excellent advantage that a part of the different wiring is not included in the figure obtained by enlarging the thicker figure, and it is possible to precisely specify the portion to which the design rule of the thicker width is applied.

The information processing unit according to the present invention is capable of generating the area indicative of the position that is apart from another wiring with respect to a certain wiring by the required minimum clearance. The area is generated, thereby making the area in which other wirings cannot be arranged definite. As a result, there is obtained such an excellent advantage that the efficiency of the operation of editing the wiring arrangement for correcting the error is remarkably improved.

What is claimed is:

1. An apparatus for designing a circuit, comprising:
an arranging element which arranges a first wiring, which is required to maintain at least a predetermined clearance between said first wiring and other wirings, and a second wiring being thinner in a wiring width than said first wiring;
a calculating element which calculates a particular part of said second wiring being required to maintain at least said predetermined clearance from other wirings; and
an area generating element which generates an area indicative of a position apart from said first wiring and said particular part by a distance corresponding to said predetermined clearance.

2. The apparatus according to claim 1, said calculating element comprising:
an enlargement calculating element which calculates a first wiring design rule distance, according to a design rule of said first wiring, indicating that said clearance is applied to other wirings within said first wiring design rule distance from said first wiring, and generates a figure by enlarging said first wiring by a distance corresponding to said first wiring design rule distance;
an extracting element which identifies a portion of said second wiring overlapping with said figure; and
a determination element which determines said overlapping portion as said particular part.

3. The apparatus according to claim 1, said area generating element comprising:
a figure generating element which generates said area by enlarging said first wiring and said particular part by said distance corresponding to said predetermined clearance.

4. The apparatus according to claim 1, wherein said area generating element generates said area which includes a first outline corresponding to said position apart from said first wiring and said particular part by a distance corresponding to said predetermined clearance and a second outline corresponding to an outline of said first wiring and said particular part.

5. The apparatus according to claim 1, wherein said second wiring is connected to said first wiring.

6. A method for designing a circuit, comprising:
arranging a first wiring, which is required to maintain at least a predetermined clearance between said first wiring and other wirings, and a second wiring being thinner in a wiring width than said first wiring;
calculating a particular part of said second wiring being required to maintain at least said predetermined clearance from other wirings; and
generating an area indicative of a position apart from said first wiring and said particular part by a distance corresponding to said predetermined clearance,
wherein at least one of the arranging, calculating, and generating is performed by a circuit design apparatus.

7. The method according to claim 6, further comprising:
calculating a first wiring design rule distance, according to a design rule of said first wiring, indicating that said required clearance is applied to other wirings within said first wiring design rule distance from said first wiring;
generating a figure by enlarging said first wiring by a distance corresponding to said first wiring design rule distance;
identifying a portion of said second figure overlapping with said figure; and determining said overlapping portion as said particular part.

8. The method according to claim 6, further comprising:
generating said area by enlarging said first wiring and said particular part by said distance corresponding to said predetermined clearance.

9. The method according to claim 6, further comprising:
generating said area which includes a first outline corresponding to said portion apart from said first wiring and said particular part by a distance corresponding to said predetermined clearance and second outline corresponding to an outline of said first wiring and said particular part.

10. An apparatus including a display device, comprising:
a first displaying element which displays a first wiring, which is required to maintain a least a predetermined clearance between said first wiring and other wirings, and a second wiring being thinner in a wiring width than said first wiring, on said display device;
a calculating element which calculates a particular part of said second wiring being required to maintain at least said predetermined clearance from other wirings; and
a second displaying element which displays an area indicative of a position apart from said first wiring and said particular part by a distance corresponding to said predetermined clearance on said display device.

11. The apparatus according to claim 10, wherein said area displayed by said second displaying element includes a first outline corresponding to said position apart from said first wiring and said particular part by a distance corresponding to said predetermined clearance and a second outline corresponding to an outline of said first wiring and said particular part, on said display device.

12. A computer readable medium storing instructions readable by a computer for performing a method of designing a circuit, said method comprising:
arranging a first wiring, which is required to maintain at least a predetermined clearance between said first wiring and other wirings, and a second wiring being thinner in a wiring width than said first wiring;
calculating a particular part of said second wiring, said particular part is required to maintain at least said predetermined clearance between said particular part and other wirings; and
generating an area indicative of a position apart from said first wiring and said particular part by a distance corresponding to said predetermined clearance.

13. The computer readable medium according to claim 12, said method further comprising:
calculating a first wiring design rule distance, according to a design rule of said first wiring, indicating that said clearance is applied to other wirings within said first wiring design rule distance from said first wiring;
generating a figure by enlarging said first wiring by a distance corresponding to said first wiring design rule distance;
identifying an overlapping portion of said second wiring overlapping with said figure; and
determining said overlapping portion as said particular part.

14. The computer readable medium according to claim 12, said method further comprising:

generating said area by enlarging said first wiring and said particular part by said distance corresponding to said predetermined clearance.

15. The computer readable medium according to claim 12, said method further comprising:

generating said area which includes a first outline corresponding to said portion apart from said first wiring and said particular part by a distance corresponding to said predetermined clearance and second outline corresponding to an outline of said first wiring and said particular part.

* * * * *